US012787400B2

(12) United States Patent
Kim

(10) Patent No.: US 12,787,400 B2
(45) Date of Patent: Nov. 3, 2026

(54) SEMICONDUCTOR DEVICE

(71) Applicant: SAMSUNG ELECTRONICS CO., LTD., Suwon-si (KR)

(72) Inventor: Hojun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 728 days.

(21) Appl. No.: 18/296,511

(22) Filed: Apr. 6, 2023

(65) Prior Publication Data

US 2023/0352562 A1 Nov. 2, 2023

(30) Foreign Application Priority Data

Apr. 29, 2022 (KR) ........................ 10-2022-0053723

(51) Int. Cl.

| | |
|---|---|
| ***H10D 64/01*** | (2025.01) |
| ***H10D 30/43*** | (2025.01) |
| ***H10D 30/67*** | (2025.01) |
| ***H10D 62/10*** | (2025.01) |
| ***H10W 20/41*** | (2026.01) |

(52) U.S. Cl.

CPC ........... *H10D 64/017* (2025.01); *H10D 30/43* (2025.01); *H10D 30/6735* (2025.01); *H10D 30/6757* (2025.01); *H10D 62/121* (2025.01); *H10W 20/435* (2026.01)

(58) Field of Classification Search

CPC ............. H10D 64/017; H10D 30/6757; H10D 62/121; H10D 84/834; H01L 21/76895; H01L 23/5286

See application file for complete search history.

(56) References Cited

U.S. PATENT DOCUMENTS

| | | | |
|---|---|---|---|
| 4,534,806 | A | 8/1985 | Magdo |
| 5,132,234 | A | 7/1992 | Kim et al. |
| 5,880,002 | A | 3/1999 | Hutter et al. |
| 10,566,431 | B2 | 2/2020 | Zhou |
| 10,680,098 | B2 | 6/2020 | Chen et al. |
| 10,930,569 | B2 | 2/2021 | Chiang et al. |
| 11,239,330 | B2 | 2/2022 | Li et al. |
| 2004/0248352 | A1 | 12/2004 | Gray et al. |

(Continued)

FOREIGN PATENT DOCUMENTS

KR 920017274 A 9/1992

*Primary Examiner* — Brian Turner

(74) *Attorney, Agent, or Firm* — Wolf, Greenfield & Sacks, P.C.

(57) ABSTRACT

A semiconductor device includes a semiconductor layer including first conductivity-type impurities; first active structures extending upwardly from the semiconductor layer and including the first conductivity-type impurities; an epitaxial layer in the semiconductor layer and including second conductivity-type impurities; second active structures extending upwardly from the epitaxial layer, between the first active structures in a first direction, and including the second conductivity-type impurities; third active structures extending upwardly from the epitaxial layer, between the second active structures in the first direction, and including the first conductivity-type impurities; and dummy gate structures intersecting the first and second active structures on the semiconductor layer, respectively, and extending in a second direction.

13 Claims, 34 Drawing Sheets

(56) References Cited

U.S. PATENT DOCUMENTS

| | | | | |
|---|---|---|---|---|
| 2013/0328162 | A1* | 12/2013 | Hu | H10D 8/00 257/E29.174 |
| 2015/0263089 | A1 | 9/2015 | Singh et al. | |
| 2020/0287046 | A1* | 9/2020 | Frougier | H10D 84/0142 |
| 2021/0091211 | A1 | 3/2021 | Kang et al. | |
| 2021/0249516 | A1* | 8/2021 | Li | H10D 30/62 |
| 2021/0296309 | A1 | 9/2021 | Chang et al. | |
| 2021/0305130 | A1* | 9/2021 | Cho | H01L 21/76898 |
| 2022/0352321 | A1* | 11/2022 | Wang | H01L 21/266 |
| 2023/0061138 | A1* | 3/2023 | Yang | H10D 84/0144 |

* cited by examiner

SEMICONDUCTOR DEVICE

CROSS-REFERENCE TO RELATED APPLICATION(S)

This application claims benefit of priority to Korean Patent Application No. 10-2022-0053723 filed on Apr. 29, 2022 in the Korean Intellectual Property Office, the disclosure of which is incorporated herein by reference in its entirety.

BACKGROUND

The present inventive concept relates to a semiconductor device.

As demand for high performance, high speed, and/or multifunctionality of semiconductor device increase, the degree of integration of semiconductor device increases. In manufacturing a semiconductor device having a fine pattern corresponding to the trend for high integration of semiconductor devices, it is required to implement patterns having a fine width or a fine separation distance. In addition, in order to overcome the limitations of operating characteristics due to the reduction in size of planar metal oxide semiconductor FETs, efforts are being made to develop semiconductor devices, including FinFETs with a three-dimensional channel structure.

SUMMARY

An aspect of the present inventive concept is to provide a semiconductor device having improved degree of integration and electrical characteristics.

According to an aspect of the present inventive concept, a semiconductor device includes a semiconductor layer including first conductivity-type impurities; first active structures extending upwardly from the semiconductor layer and including the first conductivity-type impurities; an epitaxial layer in the semiconductor layer, wherein the epitaxial layer includes second conductivity-type impurities; second active structures extending upwardly from the epitaxial layer, between the first active structures in a first direction, wherein the second active structures include the second conductivity-type impurities; third active structures extending upwardly from the epitaxial layer, between the second active structures in the first direction, wherein the third active structures include the first conductivity-type impurities; and dummy gate structures intersecting the first and second active structures on the semiconductor layer, respectively, and extending in a second direction.

According to an aspect of the present inventive concept, a semiconductor device includes a first device including a semiconductor layer including first conductivity-type impurities, first active structures extending in a first direction on the semiconductor layer and including the first conductivity-type impurities, an epitaxial layer in the semiconductor layer, wherein the epitaxial layer includes second conductivity-type impurities, second active structures extending in the first direction on the epitaxial layer and including the second conductivity-type impurities, third active structures extending in the first direction on the epitaxial layer and including the first conductivity-type impurities, and a dummy gate structure extending in a second direction on the semiconductor layer; and a second device including an active region extending in the first direction, a gate structure intersecting the active region on the active region and extending in the second direction, source layers on both sides of the gate structure, and a buried interconnection line below the source layers and electrically connected to at least a portion of the source layers.

According to an aspect of the present inventive concept, a semiconductor device includes a first semiconductor region including a semiconductor layer including first conductivity-type impurities and first active structures on the semiconductor layer; a second semiconductor region including an epitaxial layer in the semiconductor layer, wherein the epitaxial layer includes second conductivity-type impurities and second active structures on the epitaxial layer; and a third semiconductor region including third active structures on the epitaxial layer, wherein the third active structures include the first conductivity-type impurities, wherein the third active structures integrates with the epitaxial layer as a single layer, and include a lower region including the second conductivity-type impurities; and an upper region including the first conductivity-type impurities on the lower region.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
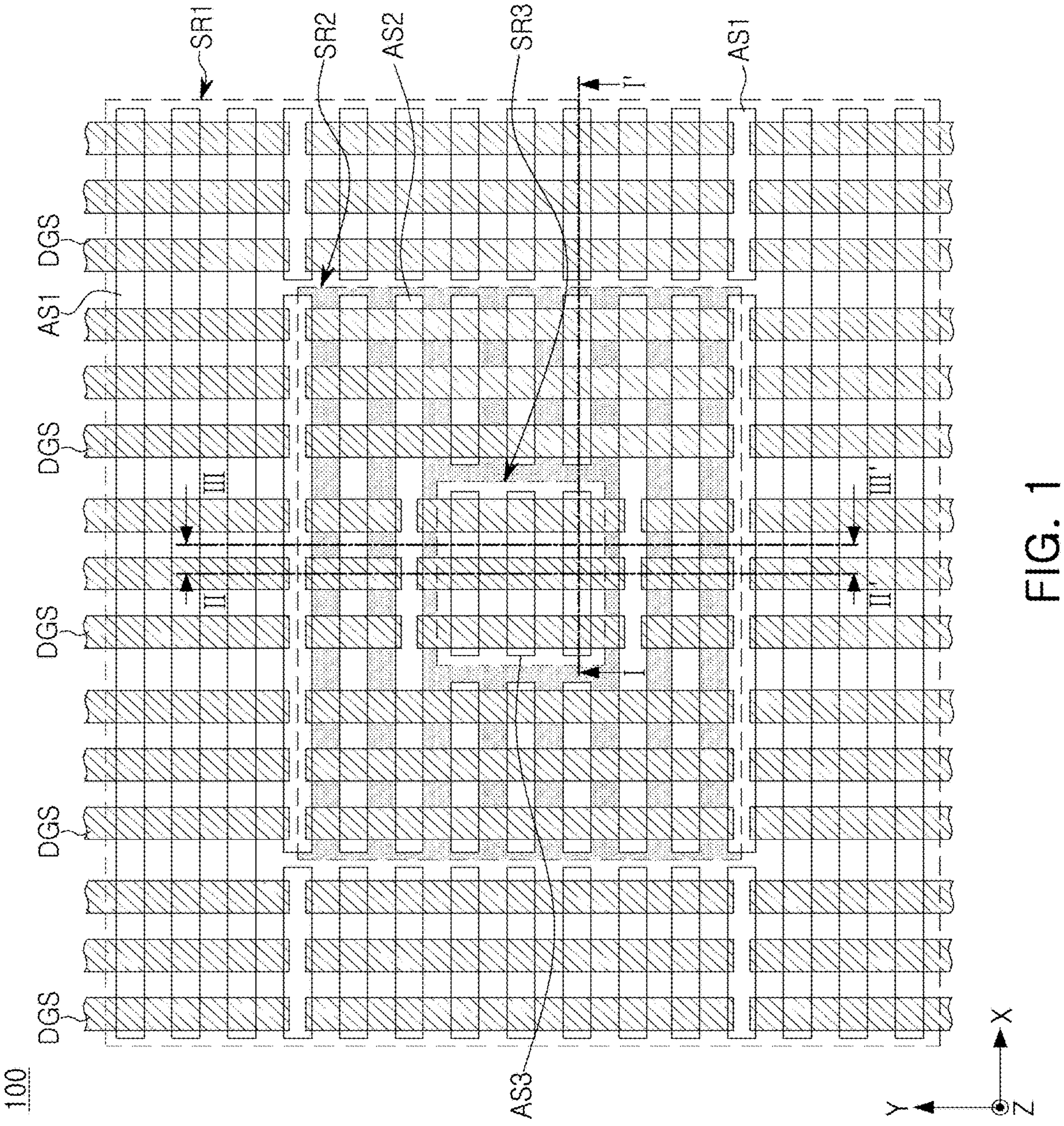
FIG. 1 is a plan view illustrating a semiconductor device according to example embodiments.

Hereinafter, preferred embodiments of the present inventive concept will be described with reference to the accompanying drawings. Hereinafter, it can be understood that terms such as 'on,' 'upper,' 'upper portion,' 'upper surface,' 'below,' 'lower,' 'lower portion,' 'lower surface,' 'side surface,' and the like may be denoted by reference numerals and refer to the drawings, except where otherwise indicated.

FIG. 1 is a plan view illustrating a semiconductor device according to example embodiments.

Figure 2A:
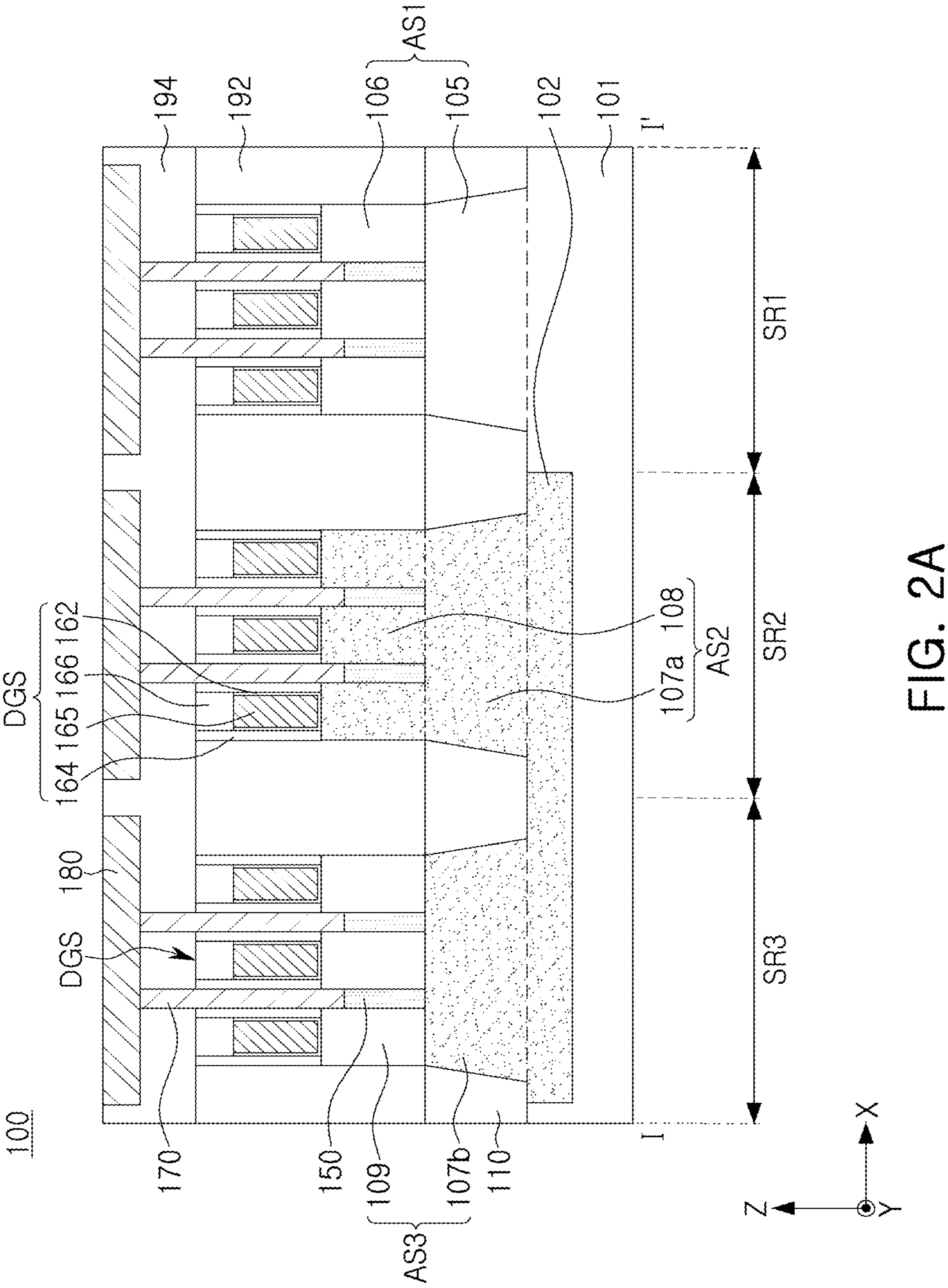
FIGS. 2A to 2C are cross-sectional views illustrating a semiconductor device according to example embodiments.
Figure 2B:
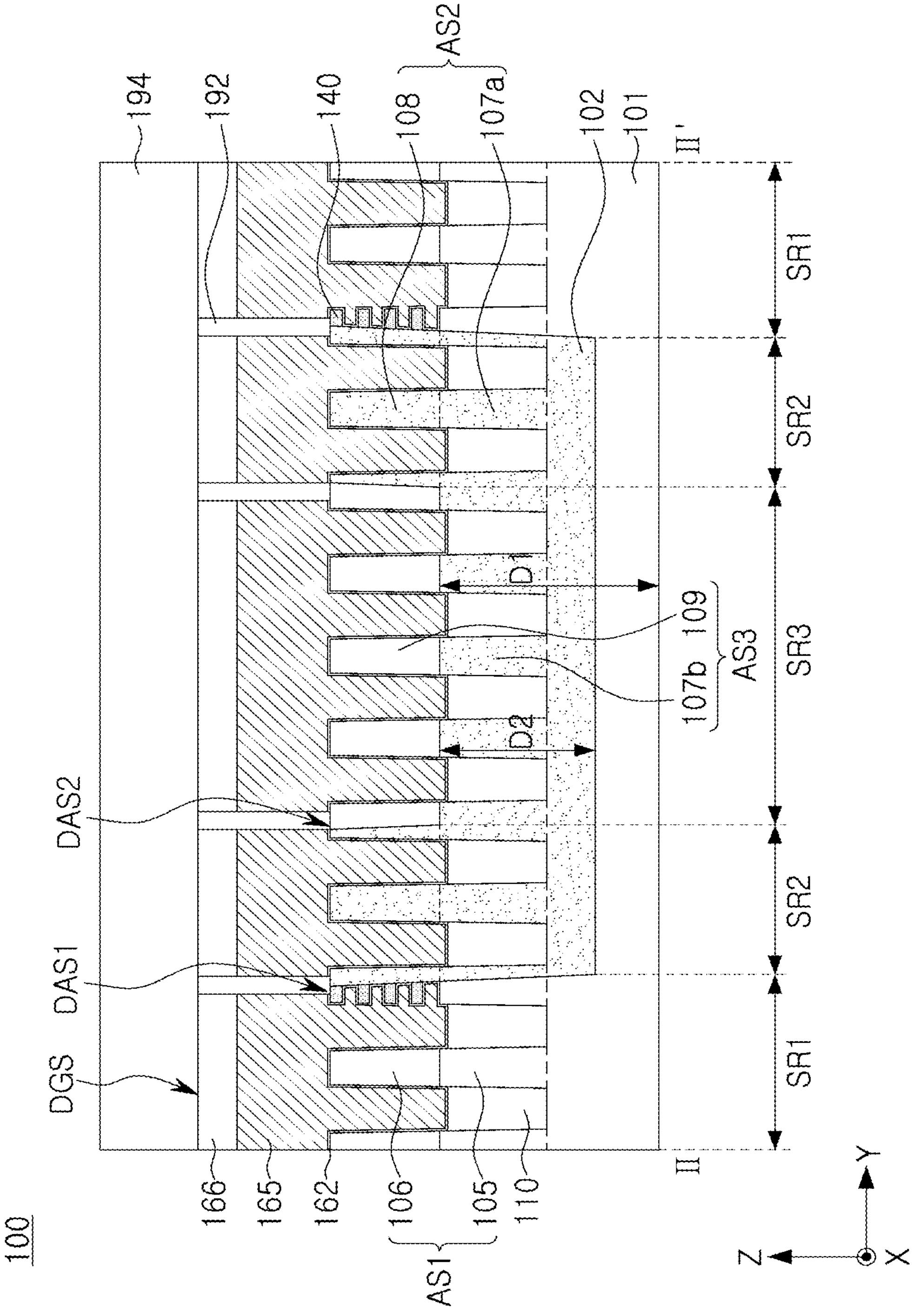
Figure 2C:
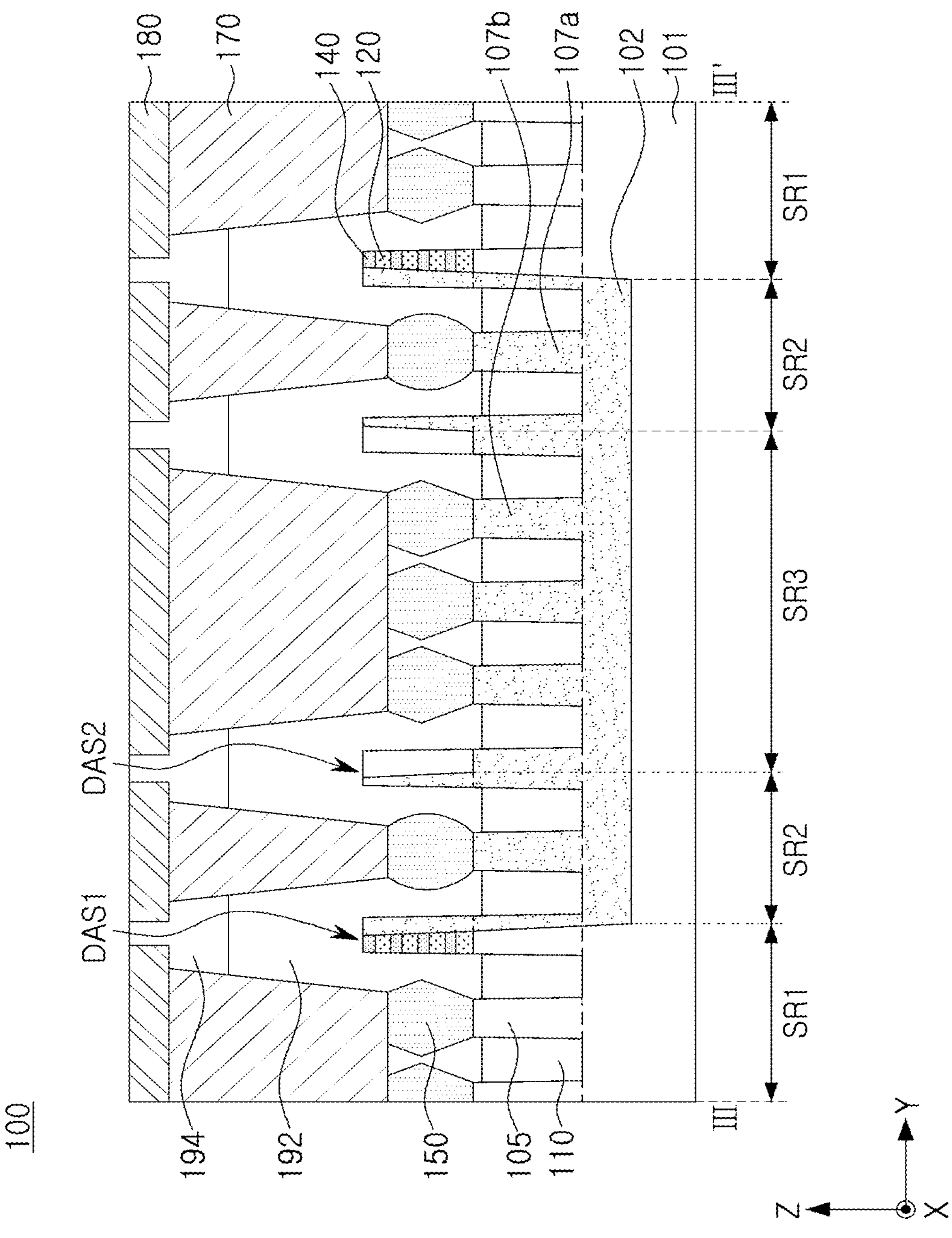

FIGS. 2A to 2C are cross-sectional views illustrating a semiconductor device according to example embodiments. FIGS. 2A to 2C illustrate cross-sections of the semiconductor device of FIG. 1, taken along lines I-I', II-II', and III-III', respectively. For convenience of description, only some components of the semiconductor device are illustrated in FIG. 1.

Referring to FIGS. 1 to 2C, a semiconductor device 100 may include a semiconductor layer 101 including first conductivity-type impurities, an epitaxial layer 102 disposed in the semiconductor layer 101 and including second conductivity-type impurities, first to third active structures AS1, AS2, and AS3 disposed on the semiconductor layer 101 and the epitaxial layer 102 in first to third semiconductor regions SR1, SR2, and SR3, respectively, a device isolation layer 110 defining the first to third active structures AS1, AS2, and AS3, and dummy gate structures DGS extending to intersect the first to third active structures AS1, AS2, and AS3. The semiconductor device 100 may further include first and second dummy active structures DAS1 and DAS2, source layers 150 disposed on a side of the dummy gate structures DGS, contact plugs 170 connected to the source layers 150, interconnection lines 180 connected to the contact plugs 170, and first and second interlayer insulating layers 192 and 194.

The semiconductor device 100 may be a bipolar junction transistor (BJT) including a first semiconductor region SR1 functioning as a collector, a second semiconductor region SR2 functioning as a base, and a third semiconductor region SR3 functioning as an emitter. The semiconductor device 100 may be a PNP device or an NPN device. Hereinafter, a PNP device will be mainly described as an embodiment.

The semiconductor layer 101 may be a substrate on which the semiconductor device 100 is manufactured, or may be a well region of the substrate. The substrate may be provided as a bulk wafer, an epitaxial layer, a silicon-on-insulator (SOI) layer, a semiconductor-on-insulator (SeOI) layer, or the like. The semiconductor layer 101 may include a semiconductor material, for example, a group IV semiconductor, a group III-V compound semiconductor, or a group II-VI compound semiconductor. For example, the group IV semiconductor may include silicon, germanium, or silicon-germanium. The semiconductor layer 101 may include first conductivity-type impurities, for example, P-type impurities.

The epitaxial layer 102 may be disposed in the semiconductor layer 101, and may include a semiconductor material. The epitaxial layer 102 may include second conductivity-type impurities having a conductivity-type different from that of the semiconductor layer 101, for example, N-type impurities. The epitaxial layer 102 may be a layer epitaxially grown on a region from which the semiconductor layer 101 is partially removed. Therefore, as compared to a case in which the epitaxial layer 102 is formed in the semiconductor layer 101 by an ion implantation process, a change in doping profile at a boundary between the semiconductor layer 101 and the epitaxial layer 102 may be more clear. A side surface of the epitaxial layer 102 may be inclined to decrease a width thereof in a downward direction, but the present inventive concept is not limited thereto. The epitaxial layer 102 may have a side surface and a lower surface covered with the semiconductor layer 101, and may be in contact with the semiconductor layer 101.

The first to third active structures AS1, AS2, and AS3 may be disposed in the first to third semiconductor regions SR1, SR2, and SR3, respectively, and may include a semiconductor material. As illustrated in FIG. 1, the first to third active structures AS1, AS2, and AS3 may be disposed to extend in one direction, for example, an X-direction, and to be spaced apart from each other in a Y-direction. The first to third active structures AS1, AS2, and AS3 may be disposed to be spaced apart from each other in the X-direction.

In a plan view, the first active structures AS1 may be disposed to surround the second active structures AS2, and the second active structures AS2 may be disposed to surround the third active structures AS3. Therefore, in at least one direction, for example, in the X-direction, the second active structures AS2 may be disposed between the first active structures AS1, and the third active structures AS3 may be disposed between the second active structures AS2. In a vertical direction, for example, in a Z-direction, the first active structures AS1 may be disposed to overlap the semiconductor layer 101, and the second and third active structures AS2 and AS3 may be disposed to overlap the semiconductor layer 101 and the epitaxial layer 102.

The first active structure AS1 may include a first lower region 105 extending upwardly from the semiconductor layer 101, and a first upper region 106 on the first lower region 105. The first lower region 105 may form a single layer, integral with the semiconductor layer 101, and the first upper region 106 may be a region epitaxially grown from the first lower region 105. Depending on a process of forming the first upper region 106, a boundary between the first lower region 105 and the first upper region 106 may or may not be distinguished. The first active structure AS1 may entirely include the same first conductivity-type impurities (e.g., P-type impurities) as the semiconductor layer 101.

The second active structure AS2 may include a second lower region 107*a* extending upwardly from the epitaxial layer 102, and a second upper region 108 on the second lower region 107*a*. The second lower region 107*a* and the second upper region 108 may form a single layer, integral with the epitaxial layer 102. The second active structure AS2 may entirely include the same second conductivity-type impurities (e.g., N-type impurities) as the epitaxial layer 102.

The third active structure AS3 may include a third lower region 107*b* extending upwardly from the epitaxial layer 102, and a third upper region 109 on the third lower region 107*b*. The third lower region 107*b* may form a single layer, integral with the epitaxial layer 102, and the third upper region 109 may be a region epitaxially grown from the third lower region 107*b*. In the third active structure AS3, the third lower region 107*b* may include the same second conductivity-type impurities as the epitaxial layer 102, and the third upper region 109 may include the same first conductivity-type impurities as the first active structure AS1. In embodiments, a relative height between the third lower region 107*b* and the third upper region 109 in the third active structure AS3, for example, a level of an interface between a region including the second conductivity-type impurities and a region including the first conductivity-type impurities may be variously changed.

According to a description manner, the semiconductor layer 101 may be illustrated to include first lower regions 105, and the epitaxial layer 102 may be illustrated to include second and third lower regions 107*a* and 107*b* and second upper regions 108.

As illustrated in FIG. 2A, on the first to third lower regions 105, 107*a*, and 107*b*, which may be a fin region, a plurality of the first to third upper regions 106, 108, and 109 may be arranged, respectively, in the X-direction. As illustrated in FIG. 2B, below the dummy gate structures DGS, upper surfaces of the first to third active structures AS1, AS2, and AS3 may be located on a higher level than an upper surface of the device isolation layer 110, and may have a shape protruding from the device isolation layer 110.

Upper surfaces of the first to third lower regions 105, 107*a*, and 107*b* may be located on the same level as or higher than the upper surface of the device isolation layer 110. As illustrated in FIG. 2C, the first to third active structures AS1, AS2, and AS3 may be partially recessed from both sides of the dummy gate structures DGS. For example, a portion including the first to third upper regions 106, 108, and 109 may be recessed, and the source layers 150 may be disposed in the recessed regions. In some embodiments, the first to third upper regions 106, 108, and 109 may not be entirely recessed, and a portion thereof may remain below the source layers 150.

In the semiconductor device 100, the semiconductor layer 101 and the first active structures AS1 in the first semiconductor region SR1 may function as the collector, the epitaxial layer 102 and the second active structures AS2 in the second and third semiconductor regions SR2 and SR3 may function as the base, and the third upper regions 109 of the third active structures AS3 in the third semiconductor region SR3 may function as the emitter. In the semiconductor device 100, the semiconductor layer 101, the epitaxial layer 102, and the third upper regions 109 may overlap each other vertically, to form a vertical PNP device.

The epitaxial layer 102, and the second and third lower regions 107*a* and 107*b* and the first to third upper regions 106, 108, and 109 of the first to third active structures AS1, AS2, and AS3 may be epitaxially grown, such that a difference in doping profile at interfaces adjacent to each other and at which a conductivity-type is changed is evident. As illustrated in FIG. 2B, a first length D1 from a lower surface of the semiconductor layer 101 to upper surfaces of the first to third lower regions 105, 107*a*, and 107*b* may be about 100 nm to about 700 nm, for example, about 100 nm to about 400 nm. A second length D2 from a lower surface of the epitaxial layer 102 to the upper surfaces of the first to third lower regions 105, 107*a*, and 107*b* may be about 100 nm to about 300 nm. By using epitaxially grown layers of the epitaxial layer 102 and the first to third active structures AS1, AS2, and AS3, while reducing the first length D1, the doping profile may be more readily controlled, compared to a case in which the epitaxial layer 102 and the first to third active structures AS1, AS2, and AS3 are formed by the ion implantation process.

The first and second dummy active structures DAS1 and DAS2 may be disposed between the first semiconductor region SR1 and the second semiconductor region SR2 and between the second semiconductor region SR2 and the third semiconductor region SR3, respectively. The dummy gate structures DGS on the first and second dummy active structures DAS1 and DAS2 may be spaced apart from each other in the Y-direction. Positions at which the dummy gate structures DGS are spaced apart in the Y-direction are not limited thereto.

As illustrated in FIG. 2B, the first and second dummy active structures DAS1 and DAS2 may have structures different from each other in left and right regions in the Y-direction. In the first dummy active structure DAS1, a first region facing (adjacent to) the second active structures AS2 may have the same structure as the second active structures AS2, and may include the second conductivity-type impurities. In the first dummy active structure DAS1, a second region facing (adjacent to) the first active structures AS1 may include the first lower region 105, and channel layers 140 disposed on the first lower region 105 to be spaced apart from each other, and may include the first conductivity-type impurities. The channel layers 140 may be formed, together with channel layers of a device disposed in a region not illustrated in the semiconductor device 100. This will be described in more detail with reference to FIGS. 8A to 8C below. The channel layers 140 may be dummy channel layers in the semiconductor device 100 of the present embodiment. The channel layers 140 may include a doped or undoped semiconductor material.

In the second dummy active structure DAS2, a first region facing (adjacent to) the second active structures AS2 may have the same structure as the second active structures AS2, and may include the second conductivity-type impurities. In the second dummy active structure DAS2, a second region facing (adjacent to) the third active structures AS3 may have the same structure as the third active structures AS3, and may include the first conductivity-type impurities.

As illustrated in FIG. 2C, the first and second dummy active structures DAS1 and DAS2 may not be recessed outside the dummy gate structure DGS. However, the first and second dummy active structures DAS1 and DAS2 may also have a shape recessed outside the dummy gate structure DGS, according to a range of a mask layer when the source layers 150 are formed during a manufacturing process of the semiconductor device 100.

The device isolation layer 110 may be disposed in the semiconductor layer 101 and the epitaxial layer 102 to at least define the first to third lower regions 105, 107*a*, and 107*b* of the first to third active structures AS1, AS2, and AS3. The device isolation layer 110 may be disposed between the first to third active structures AS1, AS2, and AS3. The device isolation layer 110 may be formed by, for example, a shallow trench isolation (STI) process. The device isolation layer 110 may be formed of an insulating material, for example, an oxide, a nitride, or a combination thereof.

The dummy gate structures DGS may cross the first to third active structures AS1, AS2, and AS3 on the first to third active structures AS1, AS2, and AS3, may extend in the Y-direction, and may be arranged to be spaced apart from each other in the X-direction. The dummy gate structures DGS may be spaced apart from each other between the first and second active structures AS1 and AS2, and may be spaced apart from each other between the second and third active structures AS2 and AS3, in the Y-direction. The dummy gate structures DGS may have a configuration to which no electrical signal is applied, and/or may be a layer that does not substantially perform an electrical function in the semiconductor device 100. As illustrated in FIG. 2A, the dummy gate structure DGS may include a gate dielectric layer 162, gate spacer layers 164, a gate electrode 165, and a gate capping layer 166.

The gate dielectric layer 162 may be disposed between the first to third active structures AS1, AS2, and AS3 and the gate electrode 165, and may be disposed to cover at least a portion of surfaces of the gate electrode 165. For example, the gate dielectric layer 162 may be disposed to surround all surfaces except an upper surface of the gate electrode 165. The gate dielectric layer 162 may extend between the gate electrode 165 and the gate spacer layers 164, but the present inventive concept is not limited thereto. The gate dielectric layer 162 may include an oxide, a nitride, or a high-K material. The high-K material may refer to a dielectric material having a higher dielectric constant than that of a silicon oxide film ($SiO_2$). In some embodiments, the gate dielectric layer 162 may be formed as a multilayer film.

The gate electrode 165 may include a conductive material, and may include, for example, a metal nitride such as titanium nitride (TiN), tantalum nitride (TaN), or tungsten nitride (WN), and/or a metallic material such as aluminum (Al), tungsten. (W), molybdenum (Mo), or the like, or a semiconductor material such as doped polysilicon. In some embodiments, the gate electrode 165 may be formed as two or more multilayer structures.

The gate capping layer 166 may be disposed on the gate electrode 165. The gate capping layer 166 may include an insulating material. In some embodiments, a relative arrangement of and a position of an interface between the gate capping layer 166, the gate spacer layers 164, and the first and second interlayer insulating layers 192 and 194 may be variously changed. For example, the gate spacer 164 may be on sidewalls of the gate electrode 165 and the gate capping layer 166 and upper surface of the gate spacer 164 is at the same level of the upper surface of the capping layer 166, but the present inventive concept is not limited thereto.

The gate spacer layers 164 may be disposed on both side surfaces of the gate electrode 165 and both side surfaces of the gate capping layer 166 in the X-direction. According to embodiments, a shape of the gate spacer layers 164 may be variously changed, and the gate spacer layers 164 may have a multilayer structure. The gate spacer layers 164 may be formed of at least one of an oxide, a nitride, or an oxynitride, and in particular, may be formed of a low-K film.

The source layers 150 may be disposed on the first to third lower regions 105, 107*a*, and 107*b* on a side surface of the dummy gate structures DGS in the X-direction. The source layers 150 may be connected to the contact plugs 170 thereon. In some embodiments, the source layers 150 may be disposed to at least partially surround side surfaces of the contact plugs 170.

As illustrated in FIG. 2C, the source layers 150 may have a polygonal shape, an elliptical shape, or the like outside the dummy gate structures DGS, but the present inventive concept is not limited thereto. The source layers 150 on the first and third lower regions 105 and 107*b* may include the first conductivity-type impurities, and the source layers 150 on the second lower regions 107*a* may include the second conductivity-type impurities. Shapes of the source layers 150 on the first and third lower regions 105 and 107*b* and shapes of the source layers 150 on the second lower regions 107*a* may be different depending on a type of impurities. For example, the source layers 150 may have a relatively polygonal shape on the first and third lower regions 105 and 107*b*, and may have a shape close to an elliptical shape on the second lower regions 107*a*, but the present inventive concept is not limited thereto.

The contact plugs 170 may pass through the first and second interlayer insulating layers 192 and 194, to be connected to the source layers 150, and may apply an electrical signal to the semiconductor layer 101, the epitaxial layer 102, and the third upper region 109. The contact plugs 170 may have inclined side surfaces in which a width of a lower portion is narrower than a width of an upper portion according to an aspect ratio, but the present inventive concept is not limited thereto. Depths of the contact plugs 170 may be variously changed in some embodiments.

In some embodiments, the contact plugs 170 may include a metal silicide layer located in a region contacting the source layers 150, and may further include a barrier layer disposed on an upper surface of the metal silicide layer and sidewalls of the contact plugs 170. The barrier layer may include, for example, a metal nitride such as titanium nitride (TiN), tantalum nitride (TaN), or tungsten nitride (WN). The contact plugs 170 may include, for example, a metal material such as aluminum (Al), tungsten (W), molybdenum (Mo), or the like. In example embodiments, the number and an arrangement of conductive layers constituting the contact plugs 170 may be variously changed.

The interconnection lines 180 may be connected to the contact plugs 170 on the contact plugs 170. The interconnection lines 180 may be electrically connected to the semiconductor layer 101 through the contact plugs 170 and the first active structures AS1, may be electrically connected to the epitaxial layer 102 through the contact plugs 170 and the second active structures AS2, and may be electrically connected to the third upper regions 109 of the third active structures AS3 through the contact plugs 170. The interconnection lines 180 electrically connected to the first to third active structures AS1, AS2, and AS3 may be spaced apart from each other, and may be electrically separated from each other. The interconnection lines 180 may include, for example, a metal material such as aluminum (Al), tungsten (W), molybdenum (Mo), or the like.

The first interlayer insulating layer 192 may be disposed to fill a space between the dummy gate structures DGS. The second interlayer insulating layer 194 may be disposed to cover upper surfaces of the dummy gate structures DGS. The first and second interlayer insulating layers 192 and 194 may include at least one of an oxide, a nitride, or an oxynitride, and may include, for example, a low-K material. In some embodiments, each of the first and second interlayer insulating layers 192 and 194 may include a plurality of insulating layers.

In the description of embodiments below, descriptions overlapping those described above with reference to FIGS. 1 to 2C will be omitted.

Figure 3A:
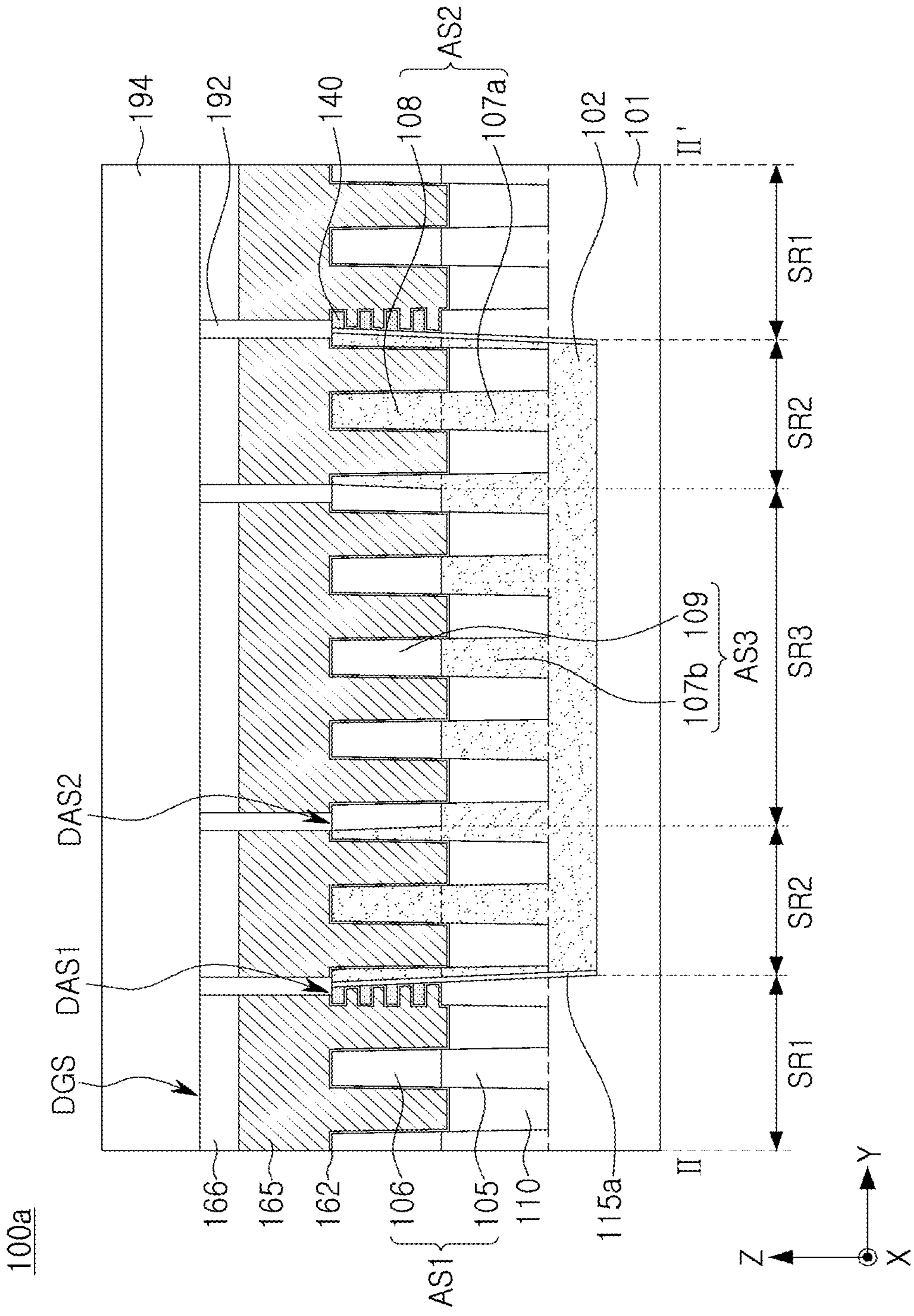
FIGS. 3A and 3B are schematic cross-sectional views illustrating semiconductor devices according to example embodiments.
Figure 3B:
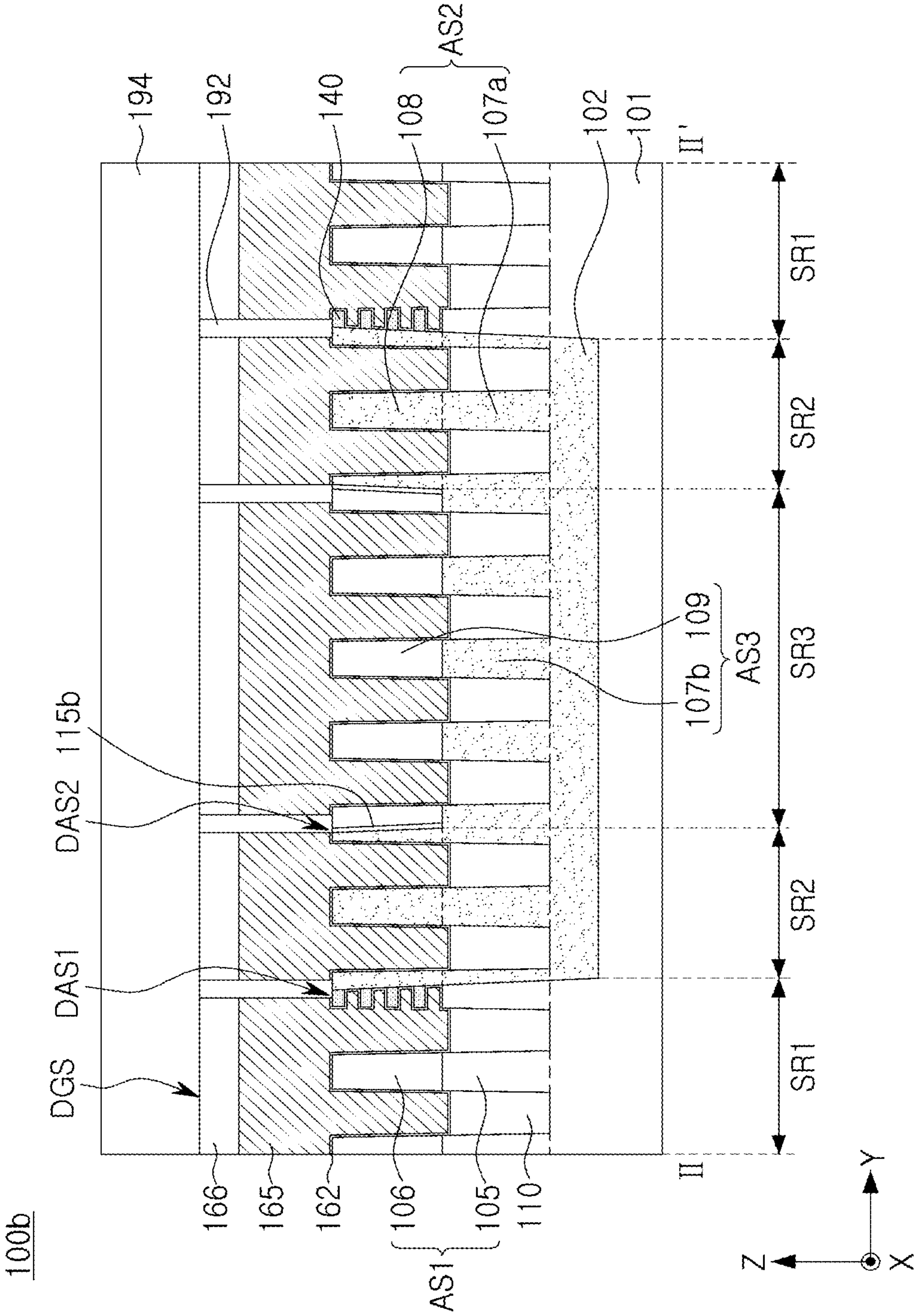

FIGS. 3A and 3B are schematic cross-sectional views illustrating semiconductor devices according to example embodiments. FIGS. 3A and 3B respectively illustrate a region corresponding to FIG. 2B.

Referring to FIG. 3A, a semiconductor device 100*a* may further include a first insulating liner layer 115*a* disposed between an epitaxial layer 102 and a semiconductor layer 101.

The first insulating liner layer 115*a* may be a layer formed before formation of the epitaxial layer 102. Therefore, the first insulating liner layer 115*a* may be disposed to cover side surfaces of the epitaxial layer 102, and may extend upwardly to be located in first dummy active structures DAS1 adjacent to a boundary between first and second semiconductor regions SR1 and SR2. In the first dummy active structure DAS1, the first insulating liner layer 115*a* may be disposed to cover an outer side surface of a second lower region 107*a* and an outer side surface of a second upper region 108. The first insulating liner layer 115*a* may include an insulating material, for example, silicon oxide or silicon oxynitride.

Referring to FIG. 3B, a semiconductor device 100*b* may further include a second insulating liner layer 115*b* disposed in a second dummy active structures DAS2.

The second insulating liner layer 115*b* may be a layer formed before formation of a third upper region 109. Therefore, the second insulating liner layer 115*b* may be disposed between the third upper region 109 and a second upper region 108 in a second dummy active structure DAS2, and may be disposed to cover an outer side surface of the third upper region 109. The second insulating liner layer 115*b* may include an insulating material, for example, silicon oxide or silicon oxynitride.

In some embodiments, the semiconductor device 100*b* may further include the first insulating liner layer 115*a* of FIG. 3A.

Figure 4A:
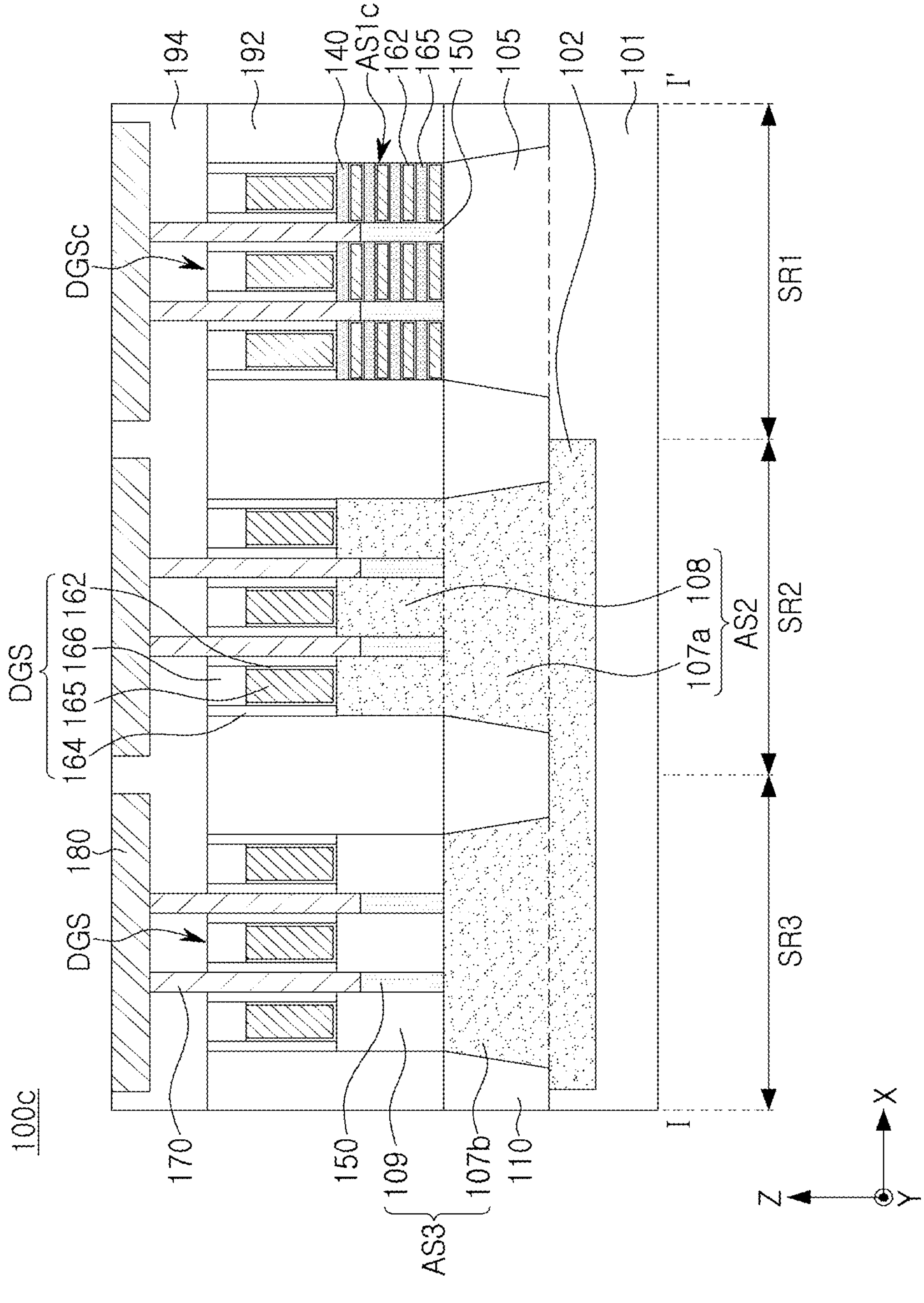
FIGS. 4A and 4B are schematic cross-sectional views illustrating a semiconductor device according to example embodiments.
Figure 4B:
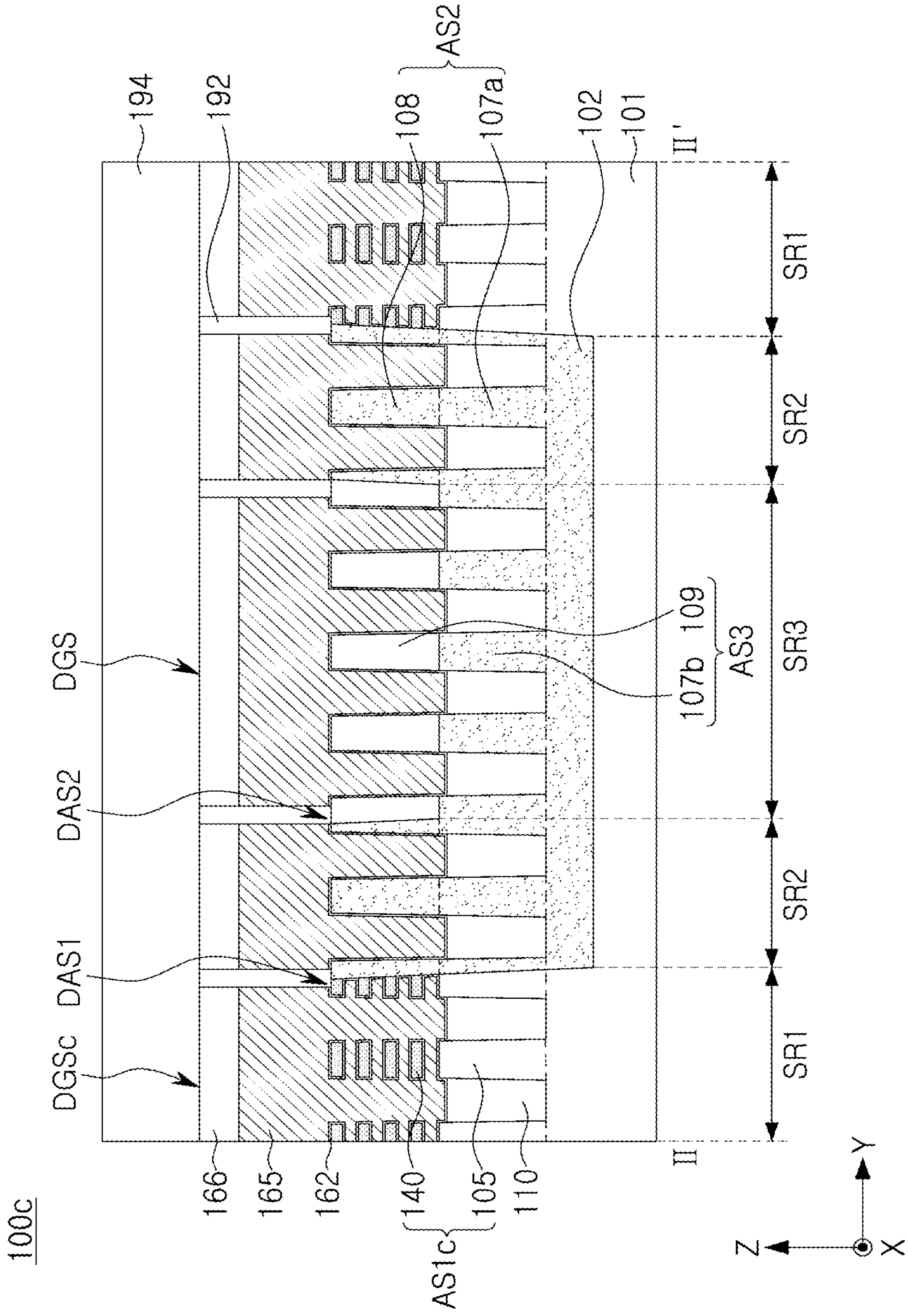

FIGS. 4A and 4B are schematic cross-sectional views illustrating a semiconductor device according to example embodiments. FIGS. 4A and 4B illustrate regions corresponding to FIGS. 2A and 2B, respectively.

Referring to FIGS. 4A and 4B, in a semiconductor device 100*c*, dummy gate structures DGSc and first active structures AS1*c* disposed in a first semiconductor region SR1 may have structures, different from that of the embodiment illustrated in FIGS. 1 to 2C.

A first active structure AS1*c* may include a first lower region 105, and channel layers 140 disposed on the first lower region 105 to be spaced apart from each other. In a dummy gate structure DGSc of the first semiconductor region SR1, gate dielectric layers 162 and a gate electrode 165 may be disposed to surround the channel layers 140.

Figure 5A:
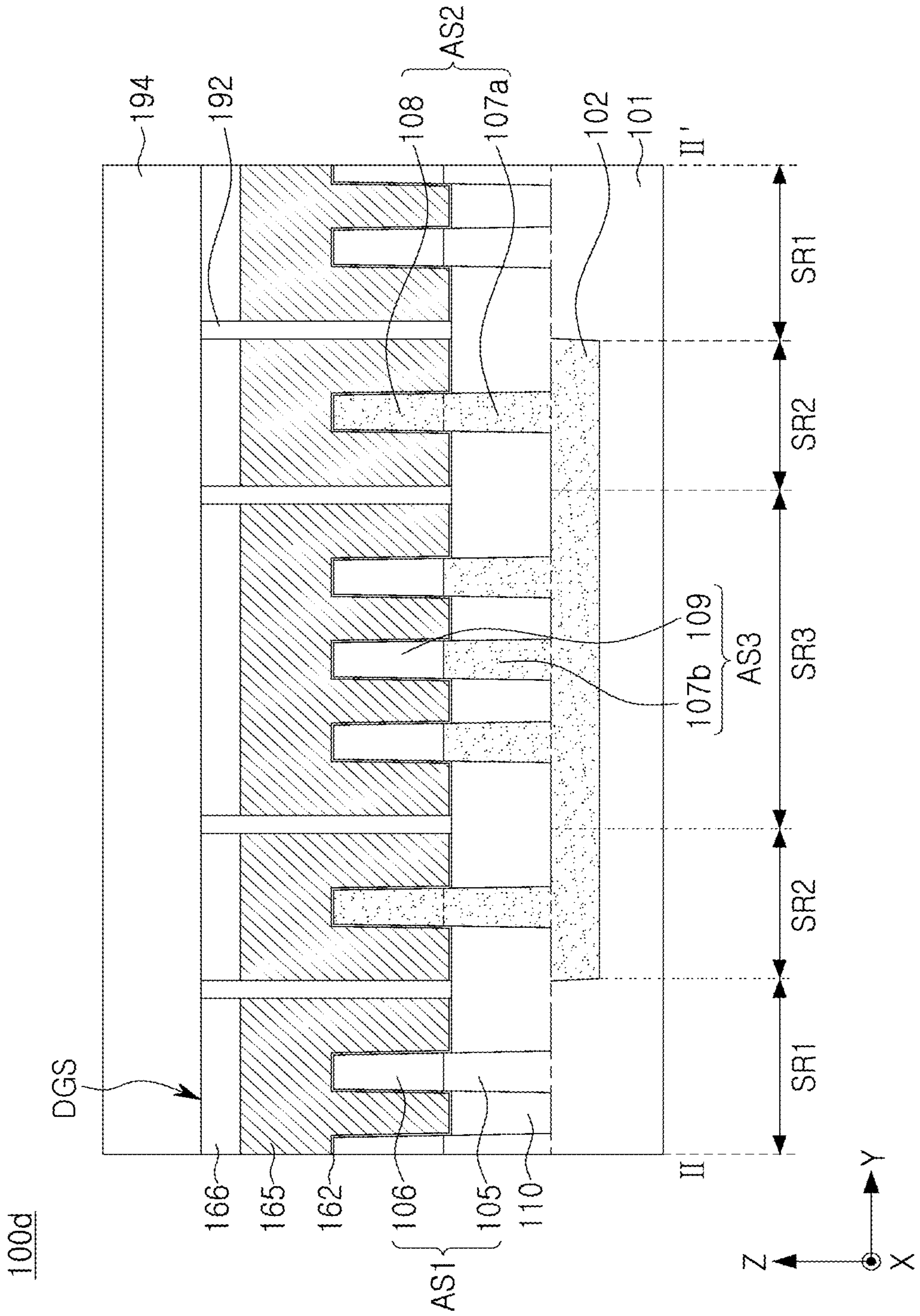
FIGS. 5A and 5B are schematic cross-sectional views illustrating semiconductor devices according to example embodiments.
Figure 5B:
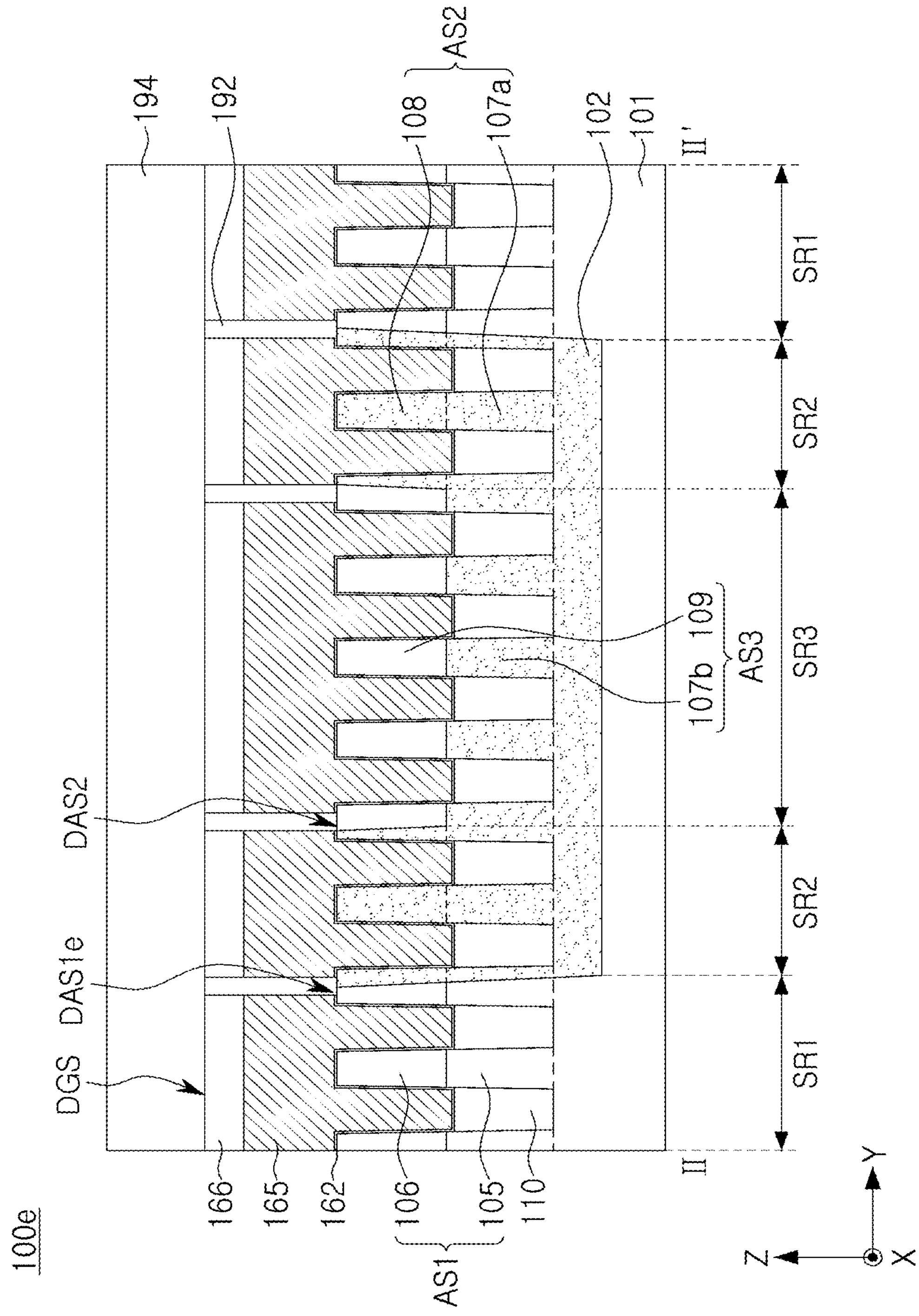

FIGS. 5A and 5B are schematic cross-sectional views illustrating semiconductor devices according to example embodiments. FIGS. 5A and 5B respectively illustrate a region corresponding to FIG. 2B.

Referring to FIG. 5A, a semiconductor device 100*d* may not include first and second dummy active structures DAS1 and DAS2, unlike in the embodiment of FIGS. 1 to 2C. As illustrated in FIG. 5A, the first and second dummy active structures DAS1 and DAS2 may not be disposed at boundaries of the first to third semiconductor regions SR1, SR2, and SR3. A first active structure AS1 and a second active structure AS2 adjacent to each other, and the second active structure AS2 and a third active structure AS3 adjacent to each other may be spaced apart by a relatively longer separation distance, but the present inventive concept is not limited thereto. For example, it may be possible that all of the first to third active structures AS1, AS2, and AS3 may be arranged at a constant distance in the Y-direction.

Referring to FIG. 5B, in a semiconductor device 100*e*, a structure of a first dummy active structure DAS1*e* may be different from that of the embodiment of FIGS. 1 to 2C.

The first dummy active structure DAS1*e* may not include channel layers 140. In the first dummy active structure DAS1*e*, a second region facing first active structures AS1 may have the same structure as the first active structures AS1. The second region may include a first lower region 105 and a first upper region 106 on the first lower region 105.

Figure 6A:
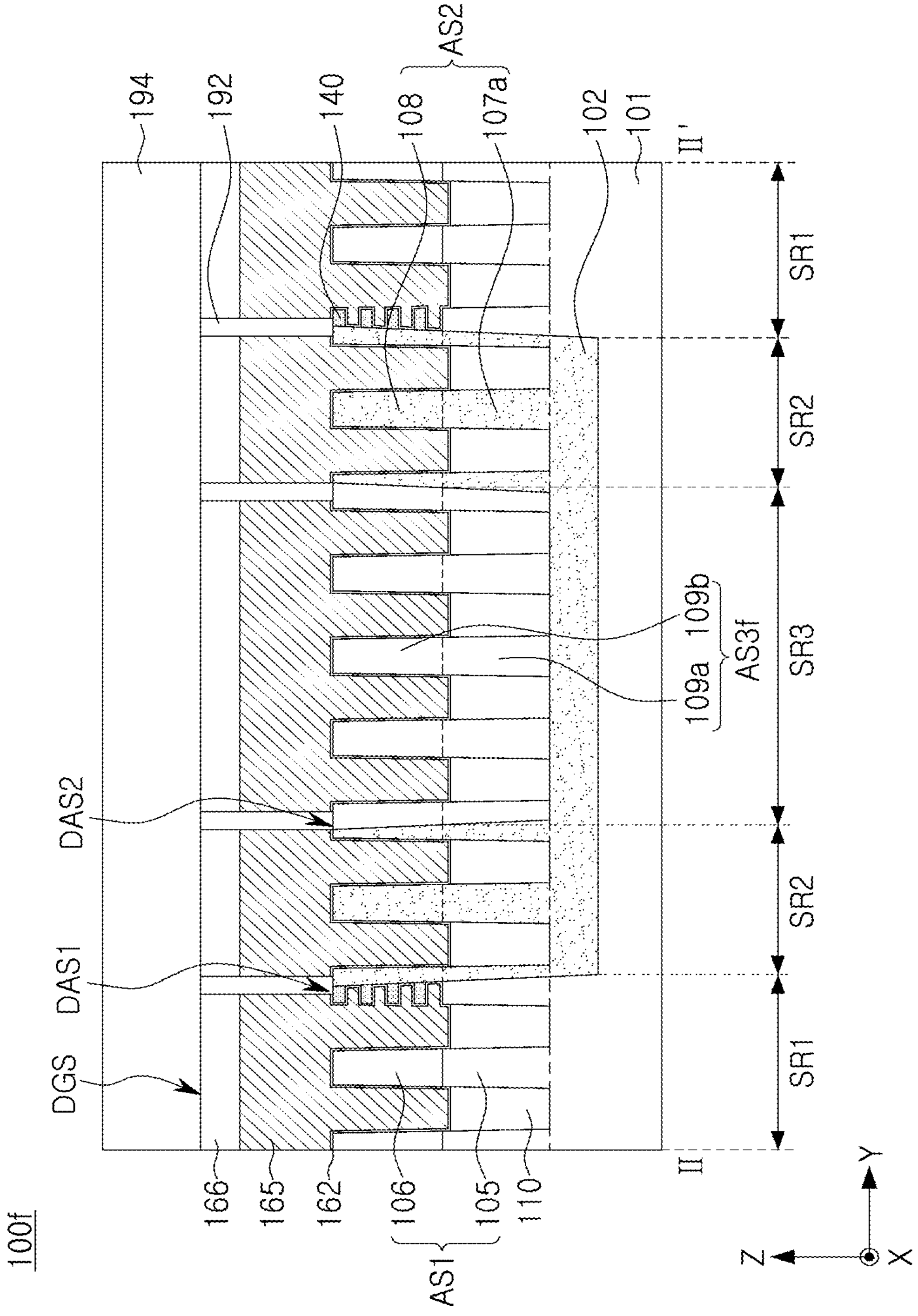
FIG. 6A is a schematic cross-sectional view illustrating a semiconductor device according to example embodiments.

FIG. 6A is a schematic cross-sectional view illustrating a semiconductor device according to example embodiments. FIG. 6A illustrates a region corresponding to FIG. 2B.

Referring to FIG. 6A, in a semiconductor device 100*f*, a structure of third active structures AS3*f* may be different from that of the embodiment of FIGS. 1 to 2C.

A third active structure AS3*f* may include a third lower region 109*a* disposed on an epitaxial layer 102 and a third upper region 109*b* disposed on the third lower region 109*a*. The third lower region 109*a* may not form a single layer with the epitaxial layer 102, and the third lower region 109*a* and the third upper region 109*b* may form a single layer integrally. In the present embodiment, the entire third active structure AS3*f* may include first conductivity-type impurities.

Figure 6B:
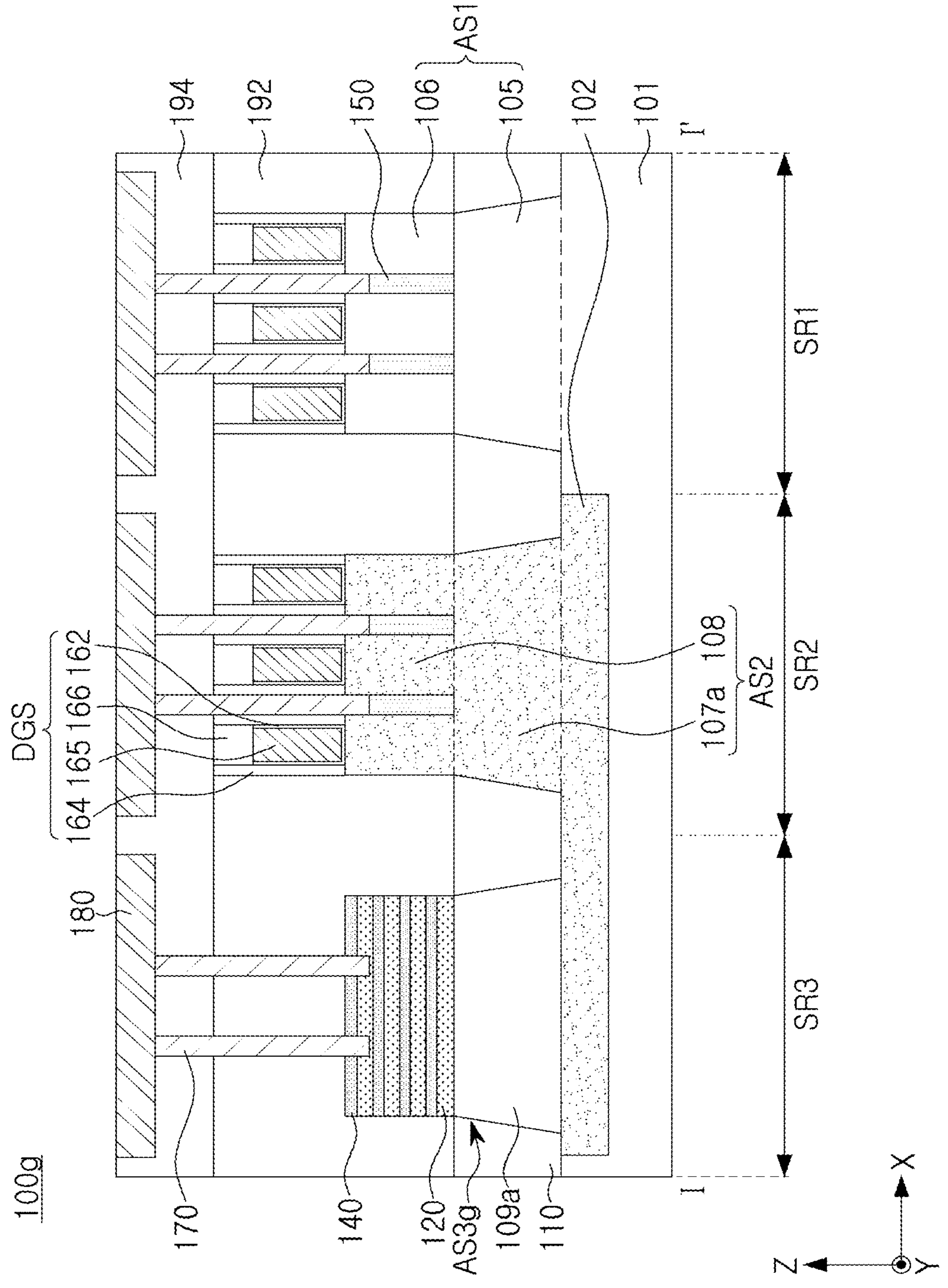
FIGS. 6B and 6C are schematic cross-sectional views illustrating a semiconductor device according to example embodiments.
Figure 6C:
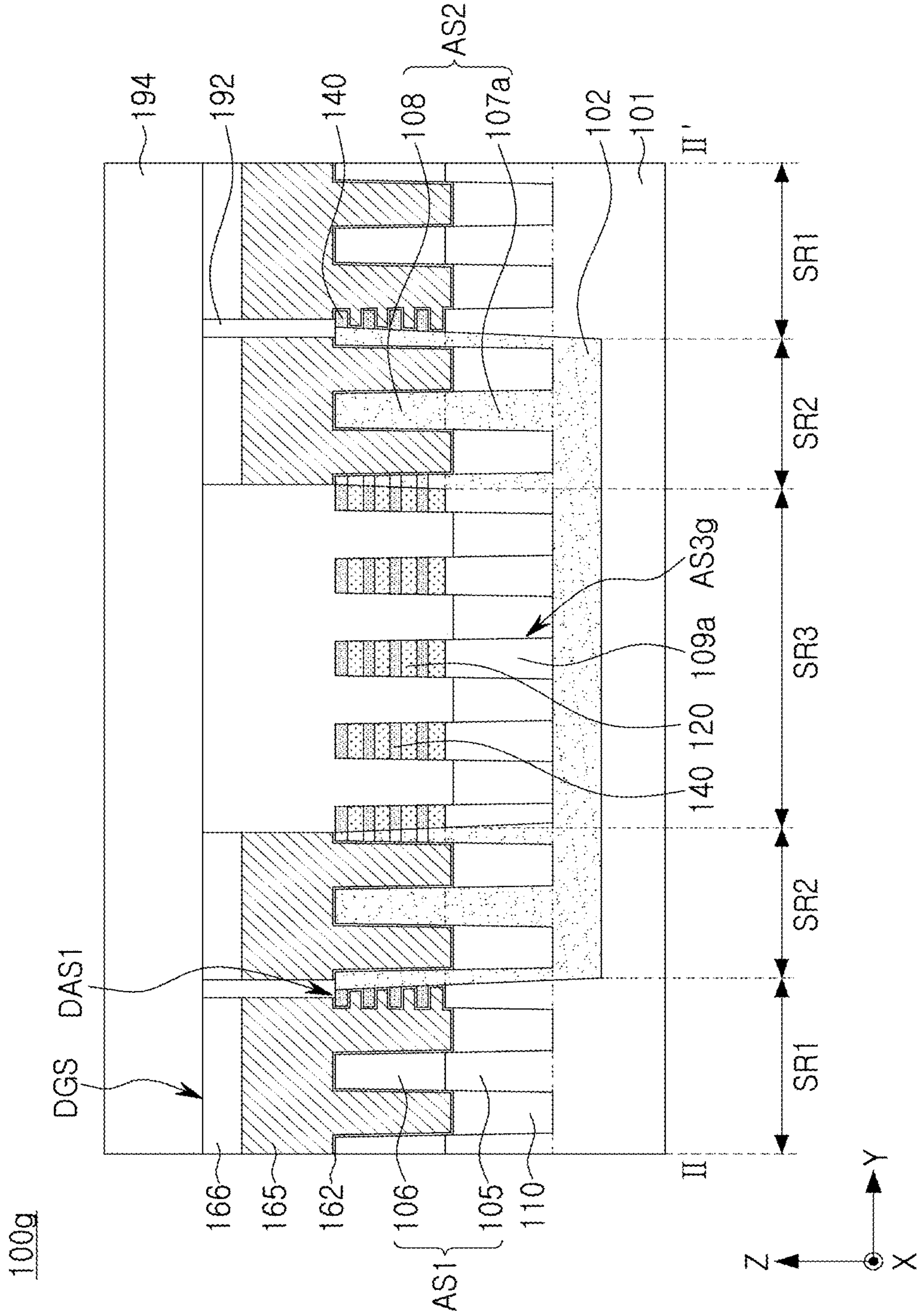

FIGS. 6B and 6C are schematic cross-sectional views illustrating a semiconductor device according to example embodiments. FIG. 6B illustrates a region corresponding to FIG. 2A, and FIG. 6C illustrates a region corresponding to FIG. 2B.

Referring to FIGS. 6B and 6C, in a semiconductor device 100*g*, a dummy gate structure DGS may not be disposed in a third semiconductor region SR3, and a third active structure AS3*g* may include a third lower region 109*a* as in the embodiment of FIG. 6A.

The third active structure AS3*g* may further include channel layers 140 and sacrificial layers 120, alternately disposed on the third lower region 109*a*. The sacrificial layers 120 may include a semiconductor material, different from that of the channel layers 140. For example, the channel layers 140 may include silicon (Si), and the sacrificial layers 120 may include silicon germanium (SiGe). An upper surface of the third active structure AS3*g* may be in contact with a first interlayer insulating layer 192. In addition to the dummy gate structure DGS, source layers 150 may not be disposed in the third semiconductor region SR3. Therefore, the channel layers 140 and the sacrificial layers 120 may not be divided by the source layers 150, and may extend horizontally on the third lower region 109*a* in the X-direction. In the third semiconductor region SR3, contact plugs 170 may be connected to a stack structure of the channel layers 140 and the sacrificial layers 120.

Figure 7:
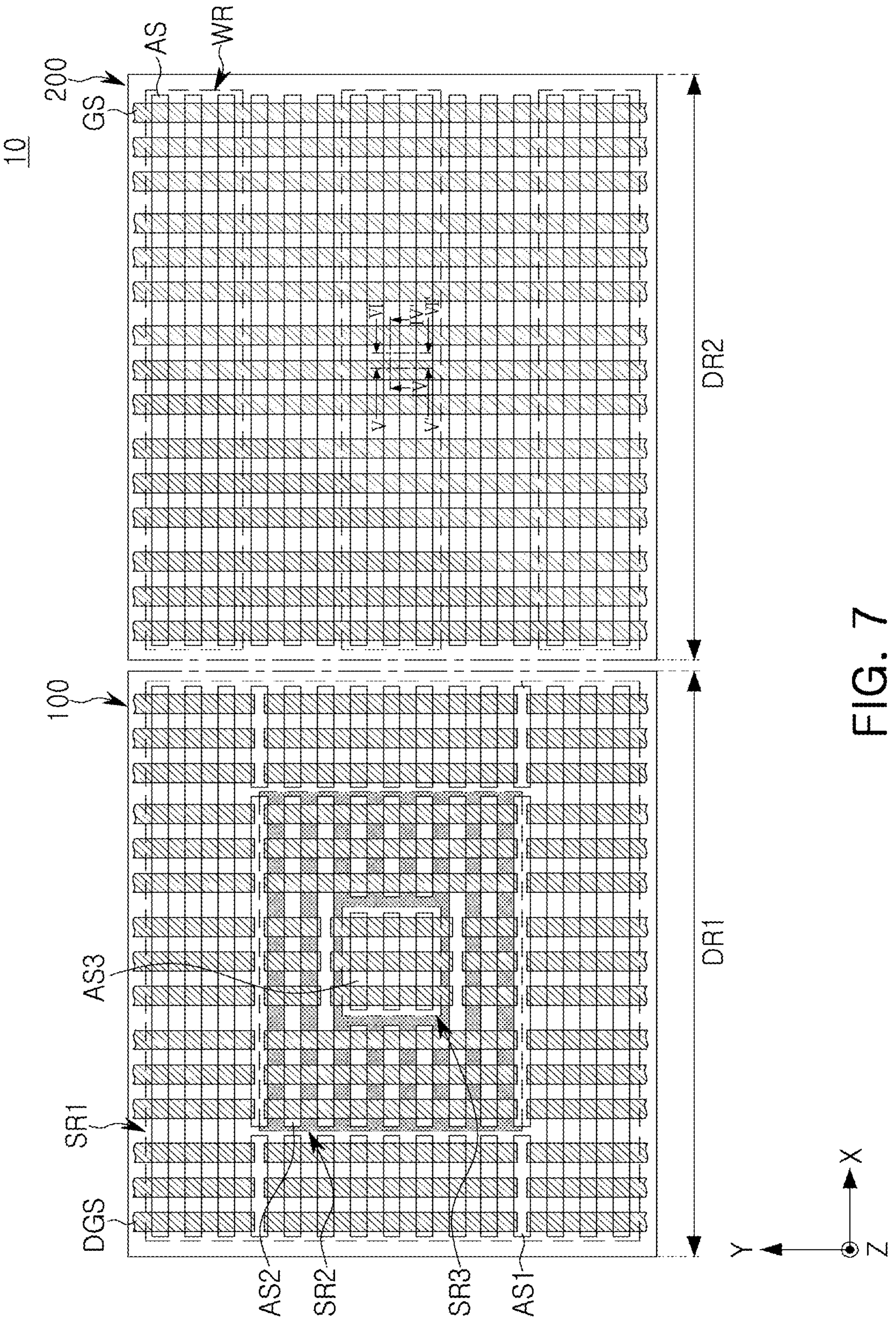
FIG. 7 is a plan view illustrating a semiconductor device according to example embodiments.

FIG. 7 is a plan view illustrating a semiconductor device according to example embodiments.

Figure 8A:
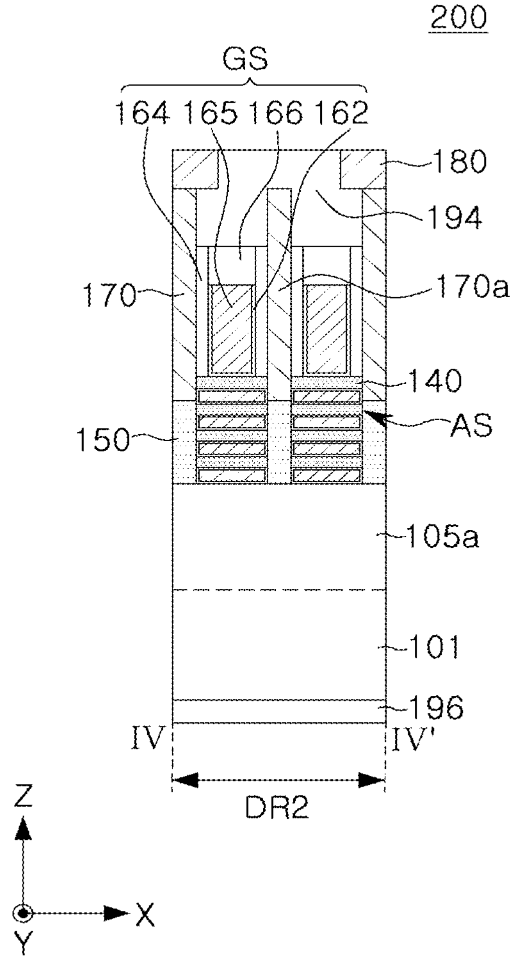
FIGS. 8A to 8C are cross-sectional views illustrating a semiconductor device according to example embodiments.
Figure 8B:
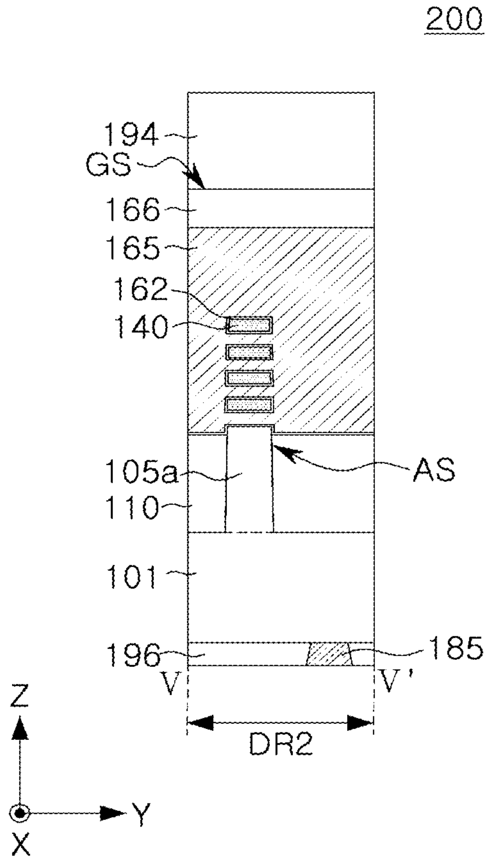
Figure 8C:
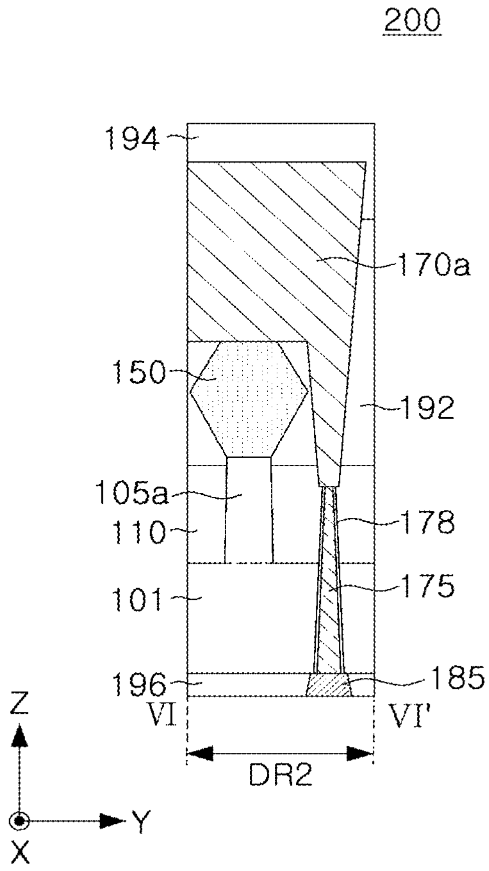

FIGS. 8A to 8C are cross-sectional views illustrating a semiconductor device according to example embodiments. FIGS. 8A to 8C illustrate cross-sections of the semiconductor device of FIG. 7, taken along lines IV-IV', V-V', and VI-VI', respectively. For convenience of description, only some components of the semiconductor device are illustrated in FIG. 7.

Referring to FIGS. 7 to 8C, a semiconductor device 10 may include a first device region DR1 including a first device 100, and a second device region DR2 including a second device 200. The first device region DR1 and the second device region DR2 may be regions adjacent to or spaced apart from each other. For the first device 100, the descriptions described above with reference to FIGS. 1 to 2C may be equally applied.

The second device 200 may include a semiconductor layer 101 including well regions WR, an active region 105*a* on the semiconductor layer 101, channel layers 140 disposed vertically on the active region 105*a* to be spaced apart from each other, a gate structure GS extending to intersect the active region 105*a*, source layers 150 contacting the channel layers 140, first and second contact plugs 170 and 170*a* connected to the source layers 150, and interconnection lines 180 on the first contact plugs 170. The second semiconductor device 200 may further include a buried interconnection line 185, below the active region 105*a*, a backside contact plug 175, a contact insulating layer 178, a device isolation layer 110, and first to third interlayer insulating layers 192, 194, and 196. The same reference numerals as in the above description with reference to FIGS. 1 to 2C refer to the same configuration, and repeated descriptions will be omitted below.

In the second device 200, the active region 105*a* may have a fin shape, and the gate electrode 165 may be disposed between the active region 105*a* and the channel layers 140, between respective layers of the channel layers 140, and on the channel layers 140. Therefore, the second device 200 may include a transistor having a multi-bridge channel FET (MBCFET™) structure, which may be a gate-all-around field effect transistor.

The active region 105*a* and the channel layers 140 may form an active structure AS. The active region 105*a* may extend on the semiconductor layer 101 to have a linear form in the X-direction. In the first device region DR1 and the second device region DR2, a lower surface of the semiconductor layer 101 may be coplanar, but the present inventive concept is not limited thereto.

The channel layers 140 may be disposed on the active region 105*a* in regions in which the active region 105*a* intersects the gate structure GS. The channel layers 140 may include two or more layers spaced apart from each other in the Z-direction. The channel layers 140 may be connected to the source layers 150. A width of each of the channel layers 140 may be equal to or narrower than a width of the active region 105*a* in the Y-direction, and a width of each of the channel layers 140 may be equal to or similar to a width of the gate structure GS in the X-direction. The channel layers 140 may be formed of a semiconductor material, and may include, for example, at least one of silicon (Si), silicon germanium (SiGe), or germanium (Ge).

The gate structure GS may be disposed to intersect the active region 105*a* and the channel layers 140, and to extend in the second direction, for example, the Y-direction. Channel regions of transistors may be formed in the channel layers 140 intersecting the gate electrode 165 of the gate structure GS. The gate structure GS may include a gate electrode 165, gate dielectric layers 162 disposed between the gate electrode 165 and the channel layers 140, gate spacer layers 164 on side surfaces of the gate electrode 165, and a gate capping layer 166 on the gate electrode 165. The gate structure GS may be formed together with a dummy gate structure DGS of the first device 100, to have the same structure.

The source layers 150 may function as source/drain regions in the second device 200. A portion of the source layers 150 may be electrically connected to the interconnection lines 180 thereon through the first contact plugs 170, and a different portion of the source layers 150 may be electrically connected to the buried interconnection line 185 below the semiconductor layer 101 through the second contact plug 170*a*.

The second contact plug 170*a* may be connected to at least a portion of the source layers 150, and may extend into the device isolation layer 110 from at least one side, as illustrated in FIG. 8C. According to embodiments, a depth to which the second contact plug 170*a* extends may be variously changed. The second contact plug 170*a* may have a shape in which a width is narrowed in a downward direction, and may be connected to the backside contact plug 175 on a lower end. The second contact plug 170*a* may include a metal material, for example, a metal material such as aluminum (Al), tungsten (W), molybdenum (Mo), or the like.

The buried interconnection line 185 may be disposed below the semiconductor layer 101 and the active region 105*a*. The buried interconnection line 185 may be disposed to extend in one direction, for example, the X-direction, but the present inventive concept is not limited thereto. The buried interconnection line 185 may be a power interconnection line for applying power or a ground voltage, and may be referred to as a buried power rail. The buried interconnection line 185 may be electrically connected to at least a portion of the source layers 150. The buried interconnection line 185 may be formed of a metal material, and may include, for example, at least one of tungsten (W), copper (Cu), aluminum (Al), cobalt (Co), ruthenium (Ru), titanium (Ti), or molybdenum (Mo).

The backside contact plug 175 may connect the second contact plug 170*a* and the buried interconnection line 185 to each other. The backside contact plug 175 may pass through the semiconductor layer 101 and the device isolation layer 110, to be connected to the second contact plug 170*a*. The backside contact plug 175 may have a cylindrical or truncated cone shape, and may have a shape in which a width narrows in an upward direction. The backside contact plug 175 may be spaced apart from the semiconductor layer 101 by the contact insulating layer 178. In some embodiments, the semiconductor layer 101 may be removed from the second device region DR2. In this case, the backside contact plug 175 may extend only into the device isolation layer 110, and the contact insulation layer 178 may also be omitted.

The backside contact plug 175 may include a metal material such as at least one of tungsten (W), copper (Cu), aluminum (Al), cobalt (Co), ruthenium (Ru), titanium (Ti), or molybdenum (Mo). The contact insulating layer 178 may include an insulating material.

The third interlayer insulating layer 196 may be disposed to surround the buried interconnection line 185. The third interlayer insulating layer 196 may include at least one of an oxide, a nitride, or an oxynitride, and may include, for example, a low-K material. In the semiconductor device 10, the third interlayer insulating layer 196 may be further disposed on a lower surface of the semiconductor layer 101 in the first device region DR1.

FIGS. 9A to 19B are views illustrating a process sequence illustrating a method of manufacturing a semiconductor device according to example embodiments. FIGS. 9A to 19B illustrate an embodiment of a method for manufacturing the semiconductor device of FIGS. 1 to 2C and the semiconductor device of FIGS. 7 to 8C. FIGS. 9A, 10 to 15A, and 17A illustrate a cross-section corresponding to FIG. 2B, and FIG. 16A illustrates a cross-section corresponding to FIG. 2C. FIGS. 9B, 15B, 16B, 17B, 18A, and 19A illustrate a cross-section corresponding to FIG. 8A, and FIGS. 18B and 19B illustrate a cross-section corresponding to FIG. 8C.

Figure 9A:
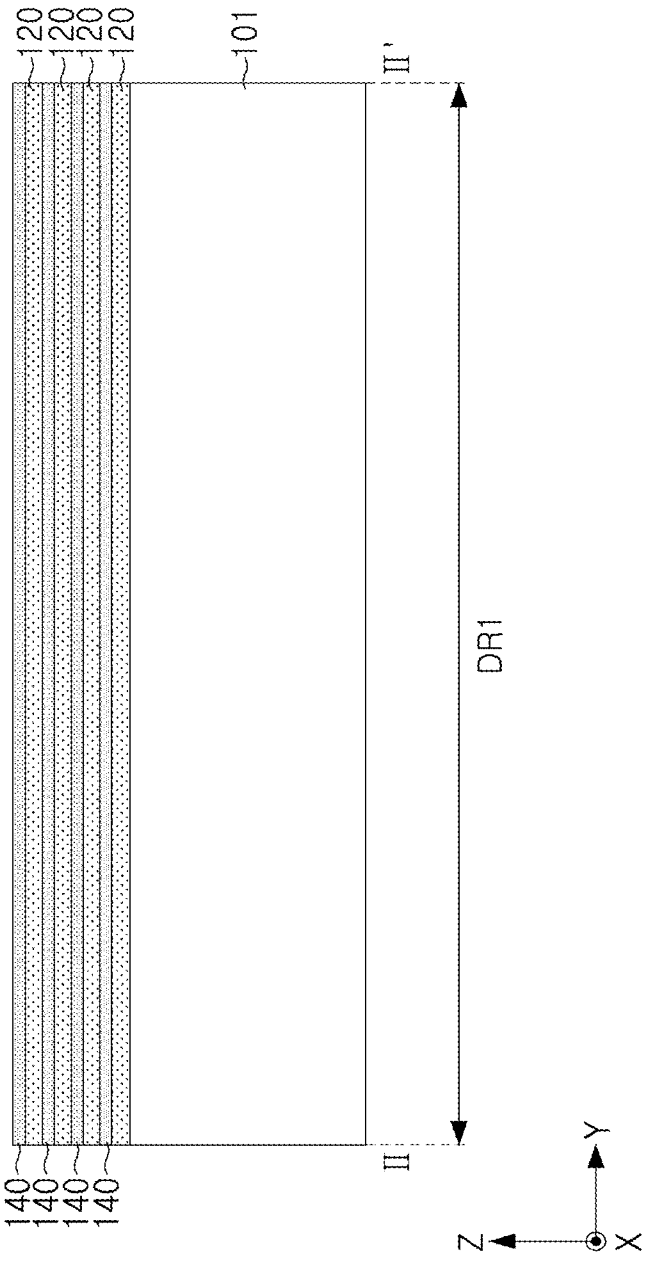
FIGS. 9A to 19B are views illustrating a process sequence illustrating a method of manufacturing a semiconductor device according to example embodiments.
Figure 9B:
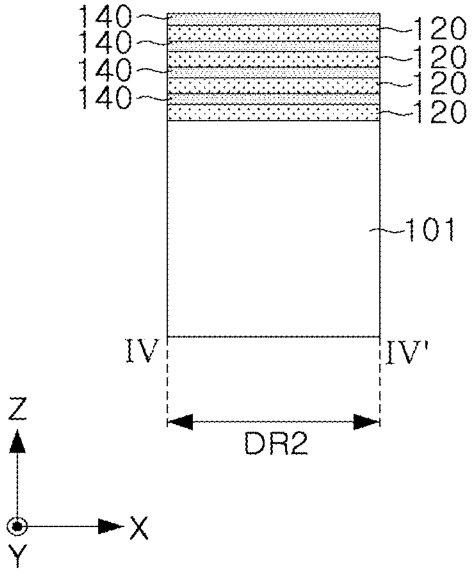

Referring to FIGS. 9A and 9B, in first and second device regions DR1 and DR2, sacrificial layers 120 and channel layers 140 may be alternately stacked on a semiconductor layer 101.

The semiconductor layer 101 may include first conductivity-type impurities, and may be, for example, a substrate including a semiconductor wafer. The sacrificial layers 120 may be replaced by a gate dielectric layer 162 and a gate electrode 165, as illustrated in FIG. 8A, through a subsequent process. The sacrificial layers 120 and the channel layers 140 may be formed by performing an epitaxial growth process from the semiconductor layer 101. The number of layers of the channel layers 140 alternately stacked with the sacrificial layers 120 may be variously changed in embodiments.

The sacrificial layers 120 may be formed of a material having etch selectivity with respect to the channel layers 140. The sacrificial layers 120 and the channel layers 140 may include, for example, a semiconductor material including at least one of silicon (Si), silicon germanium (SiGe), or germanium (Ge), but may include different materials, and may or may not include impurities. For example, the sacrificial layers 120 may include silicon germanium (SiGe), and the channel layers 140 may include silicon (Si).

Figure 10:
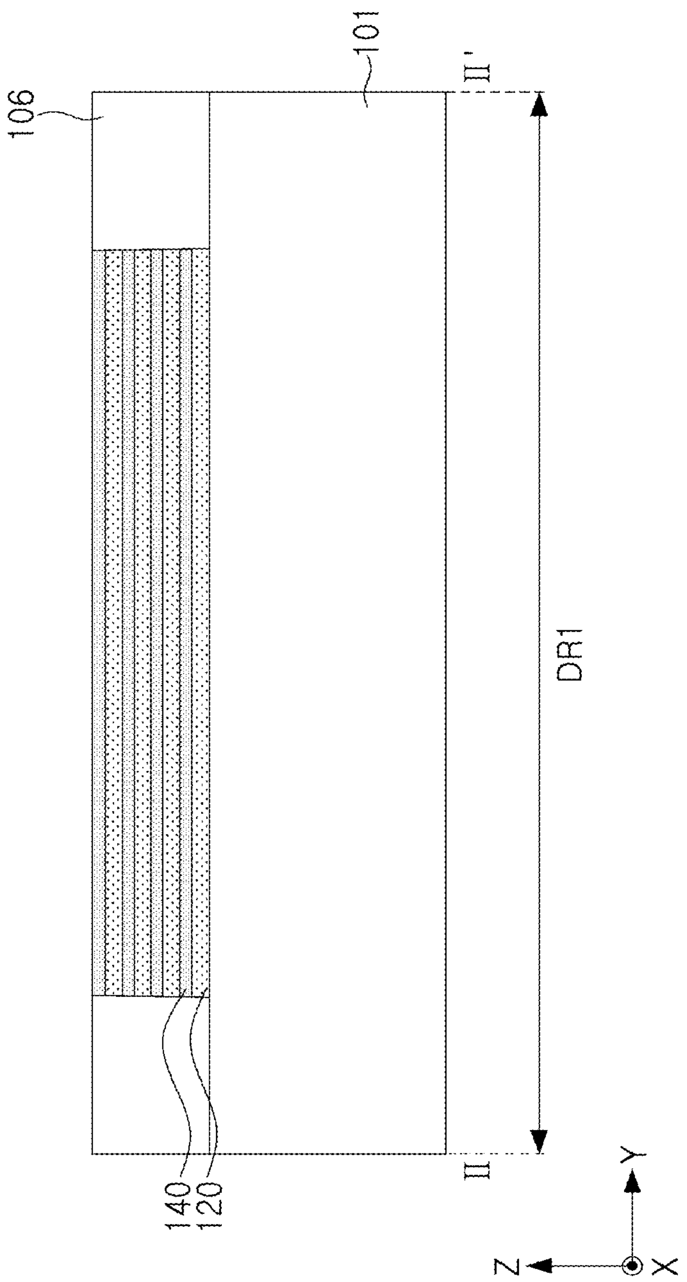

Referring to FIG. 10, in the first device region DR1, a stack structure of the sacrificial layers 120 and the channel layers 140 may be partially removed to form a first upper region 106.

The stack structure may be removed by an etching process in at least a portion of a region corresponding to the first semiconductor region SR1 of FIGS. 1 to 2C. The first upper region 106 may be formed by performing an epitaxial growth process in a region from which the stack structure is removed. The first upper region 106 may include, for example, silicon (Si), and may include in-situ doped first conductivity-type impurities.

The semiconductor device of the embodiment of FIGS. 4A and 4B may be manufactured by omitting this operation.

Figure 11:
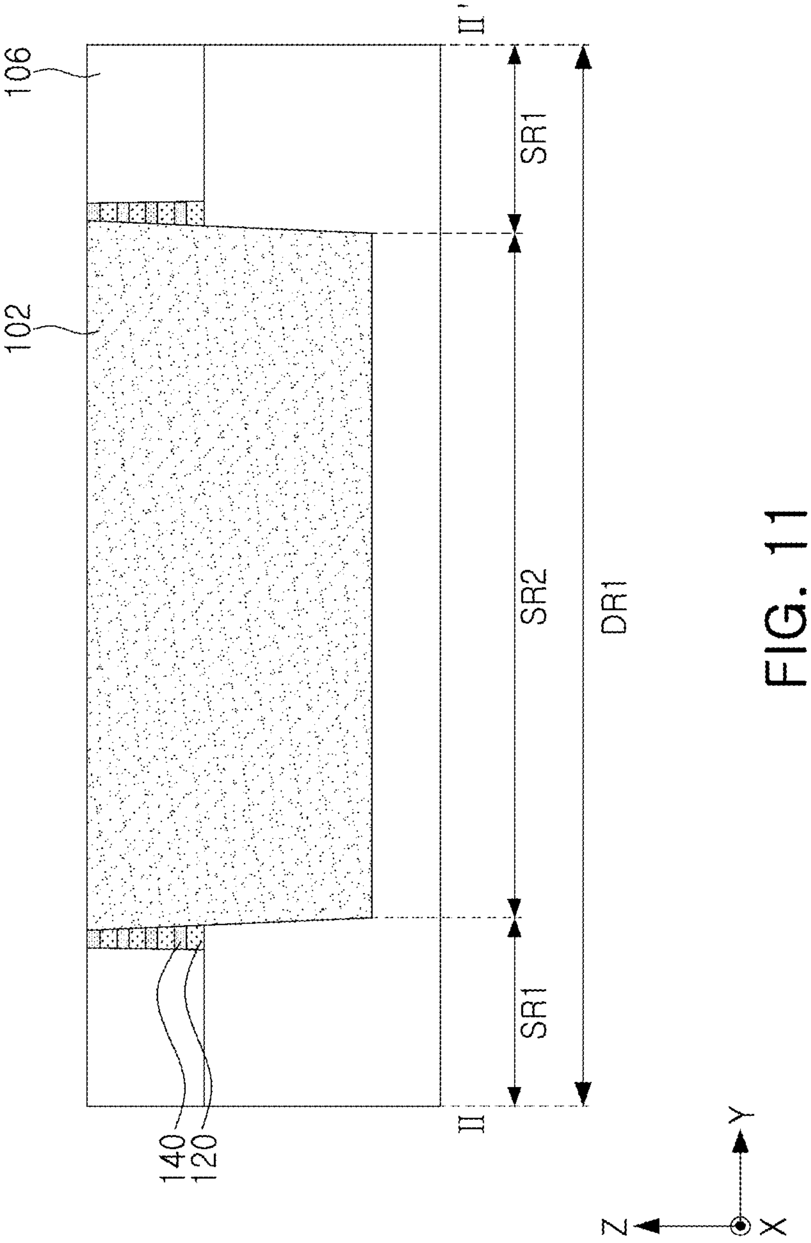

Referring to FIG. 11, in the first device region DR1, the stack structure of the sacrificial layers 120 and the channel layers 140 and the semiconductor layer 101 may be partially removed to form a trench, and an epitaxial layer 102 may be formed in the trench.

The stack structure of the sacrificial layers 120 and the channel layers 140 and the semiconductor layer 101 may be removed from regions corresponding to the second and third semiconductor regions SR2 and SR3 of FIGS. 1 to 2C. In this operation, a region in which the epitaxial layer 102 is formed may be denoted as a second semiconductor region SR2. A depth of the trench may be variously changed in some embodiments. The epitaxial layer 102 may be formed by filling the trench by performing an epitaxial growth process. The epitaxial layer 102 may include, for example, silicon (Si), and may include in-situ doped second conductivity-type impurities.

In this operation, the semiconductor device of the embodiment of FIG. 3A may be manufactured by further forming a first insulating liner layer 115*a* covering an inner side surface of the trench before formation of the epitaxial layer 102.

Figure 12:
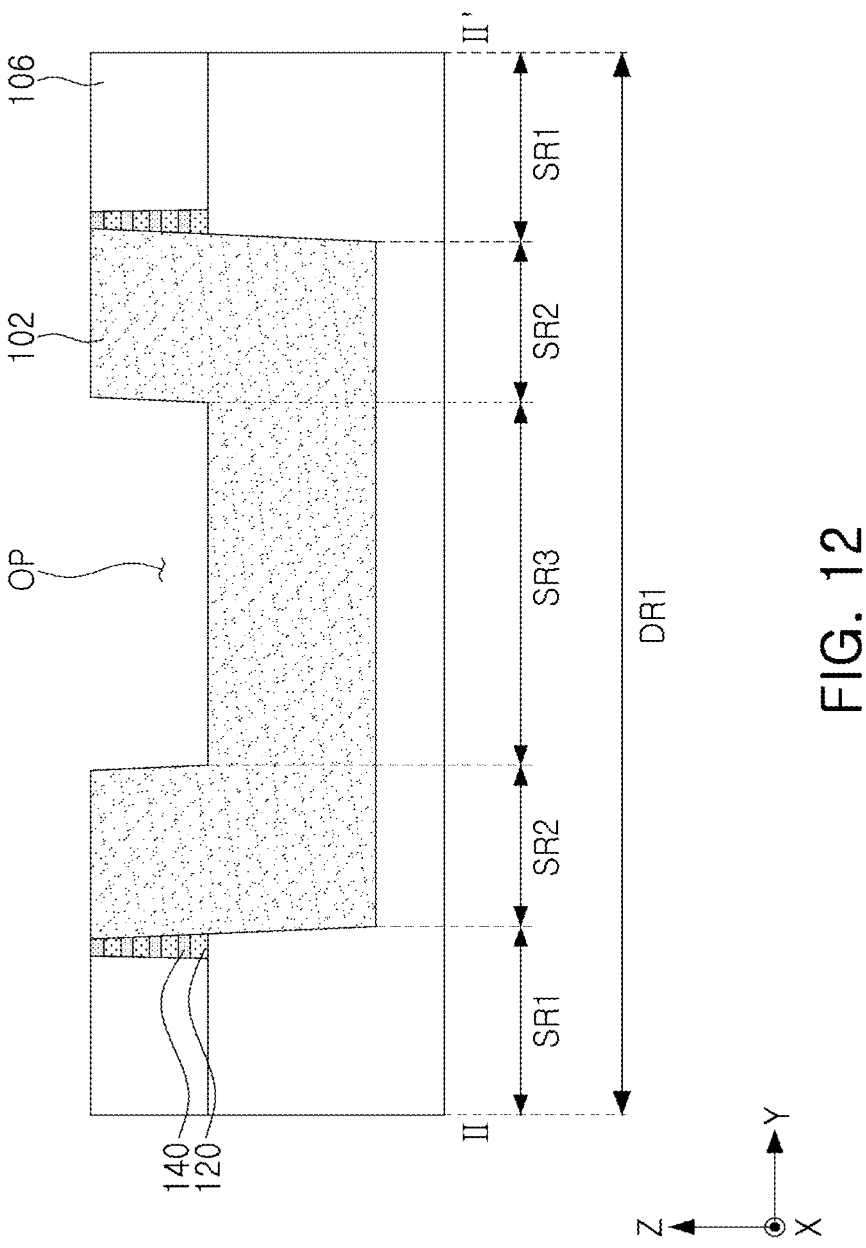

Referring to FIG. 12, in the first device region DR1, the epitaxial layer 102 may be partially removed to form an opening OP.

The epitaxial layer 102 may be removed in a region corresponding to a third semiconductor region SR3 to form an opening OP. The depth of the opening OP may be variously changed in some embodiments.

The embodiments of FIGS. 6A to 6C may be manufactured by forming the opening OP relatively deep, for example, deeper than a lower surface of a lowermost sacrificial layer 120 in this operation.

Figure 13:
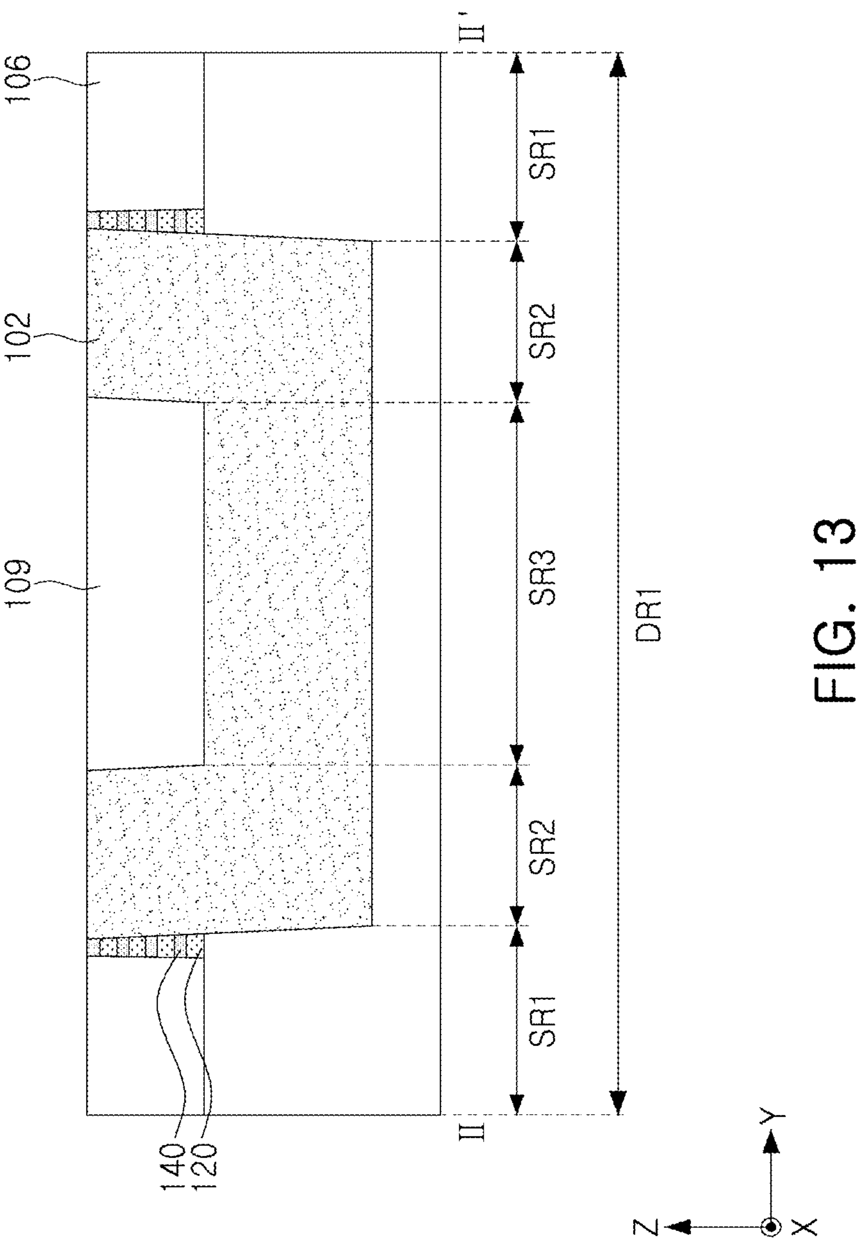

Referring to FIG. 13, in the first device region DR1, a third upper region 109 may be formed in the opening OP.

The third upper region 109 may be formed by filling the opening OP by performing an epitaxial growth process. The third upper region 109 may include, for example, silicon (Si), and may include first conductivity-type impurities doped in-situ during growth.

The processes described above with reference to FIGS. 10 to 13 may be performed only on the first device region DR1. To this end, while the above-described processes are performed, the second device region DR2 may be covered with a separate mask layer.

Figure 14:
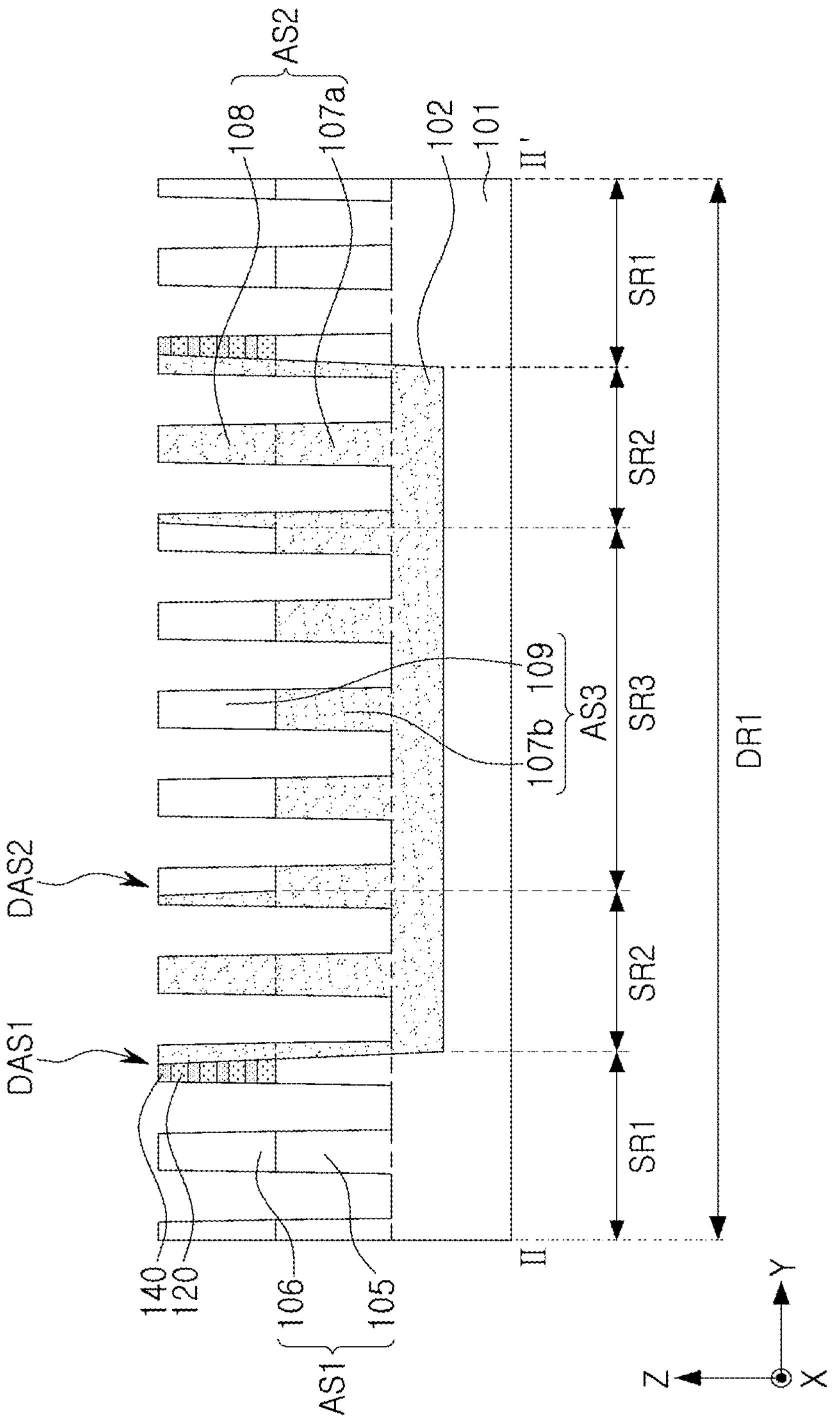

Referring to FIG. 14, in the first device region DR1, the first upper region 106, the third upper region 109, the epitaxial layer 102, and the semiconductor layer 101 may be partially removed to obtain first to third active structures AS1, AS2, and AS3.

The first to third active structures AS1, AS2, and AS3 may be formed to have a linear shape extending in one direction, for example, the X-direction, and may be formed to be spaced apart from each other in the Y-direction. The first to third active structures AS1, AS2, and AS3 may have substantially the same height and width.

Each of the first active structures AS1 may include a first lower region 105 and a first upper region 106, partially formed on the semiconductor layer 101. Each of the second active structures AS2 may include a second lower region 107*a* formed of the epitaxial layer 102, and a second upper region 108 formed of the epitaxial layer 102. In the second active structure AS2, the second lower region 107*a* and the second upper region 108 may be both formed of the epitaxial layer 102, but for convenience of explanation, a region corresponding to a height of the first lower region 105 may be referred to as the second lower region 107*a*, and a region corresponding to a height of the first upper region 106 may be referred to as the second upper region 108. Each of the third active structures AS3 may include a third lower region 107*b* formed of the epitaxial layer 102, and a third upper region 109 on the third lower region 107*b*.

In this operation, first dummy active structures DAS1 may be formed between the first semiconductor region SR1 and the second semiconductor region SR2, and second dummy active structures DAS2 may be formed between the second semiconductor region SR2 and the third semiconductor region SR3.

The same process may be also performed in the second device region DR2, to form active structures AS including the active region 105 having a linear shape extending in the X-direction, as illustrated in FIGS. 7 and 8A.

Figure 15A:
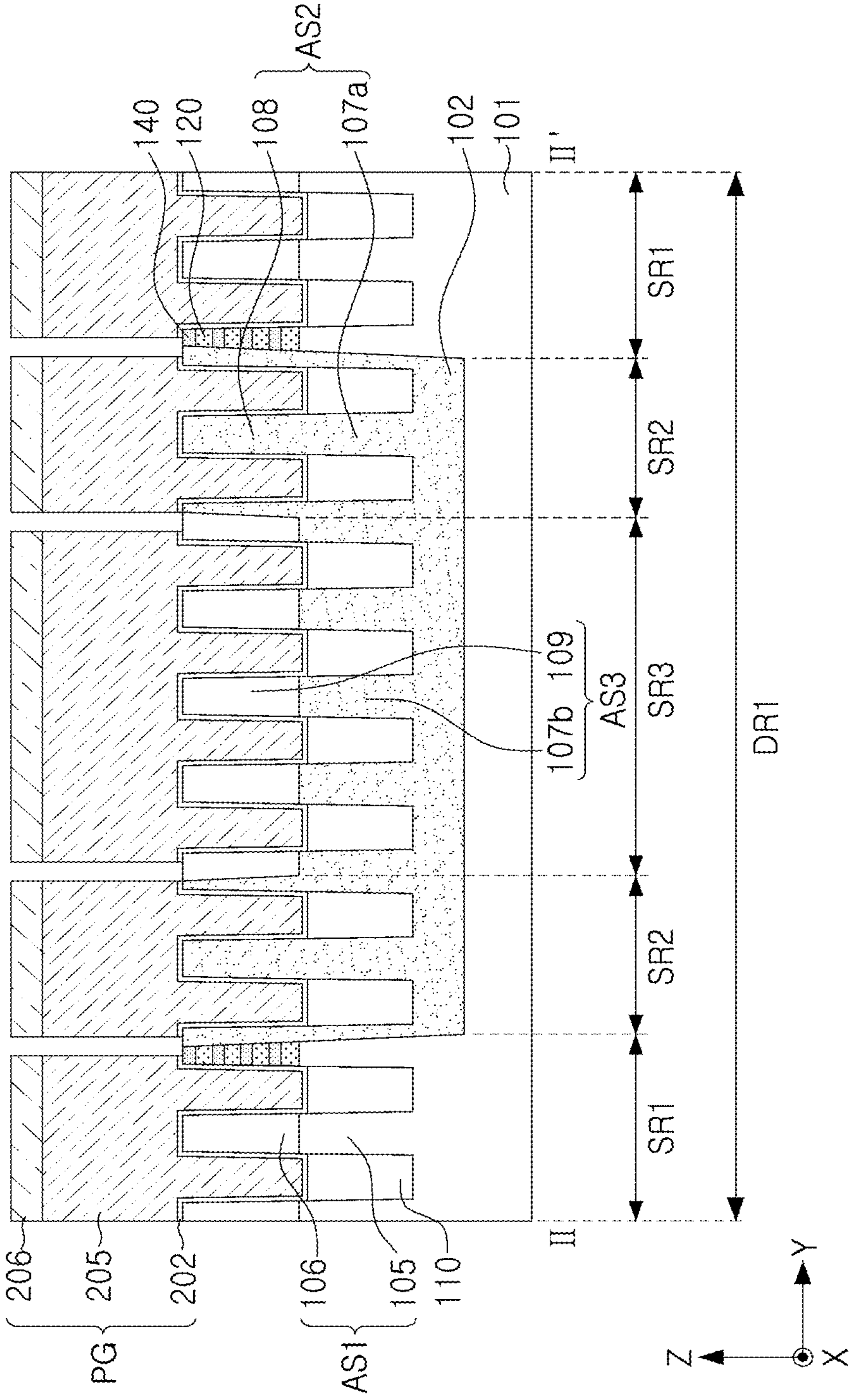
Figure 15B:
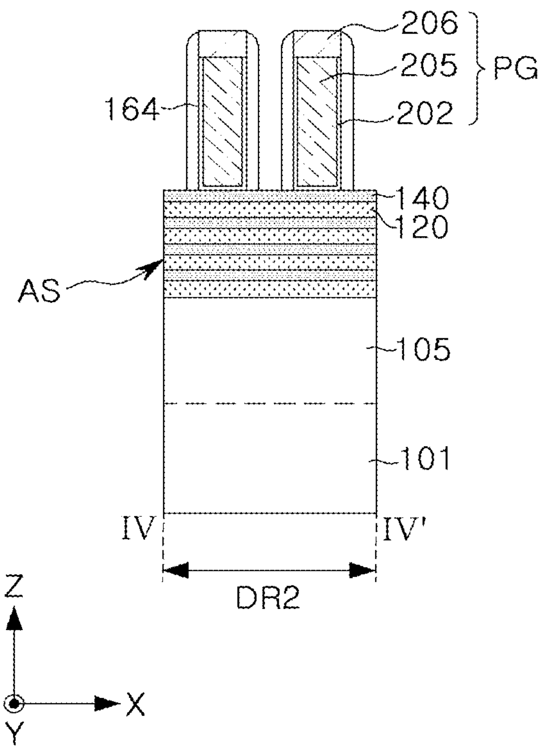
Figure 16A:
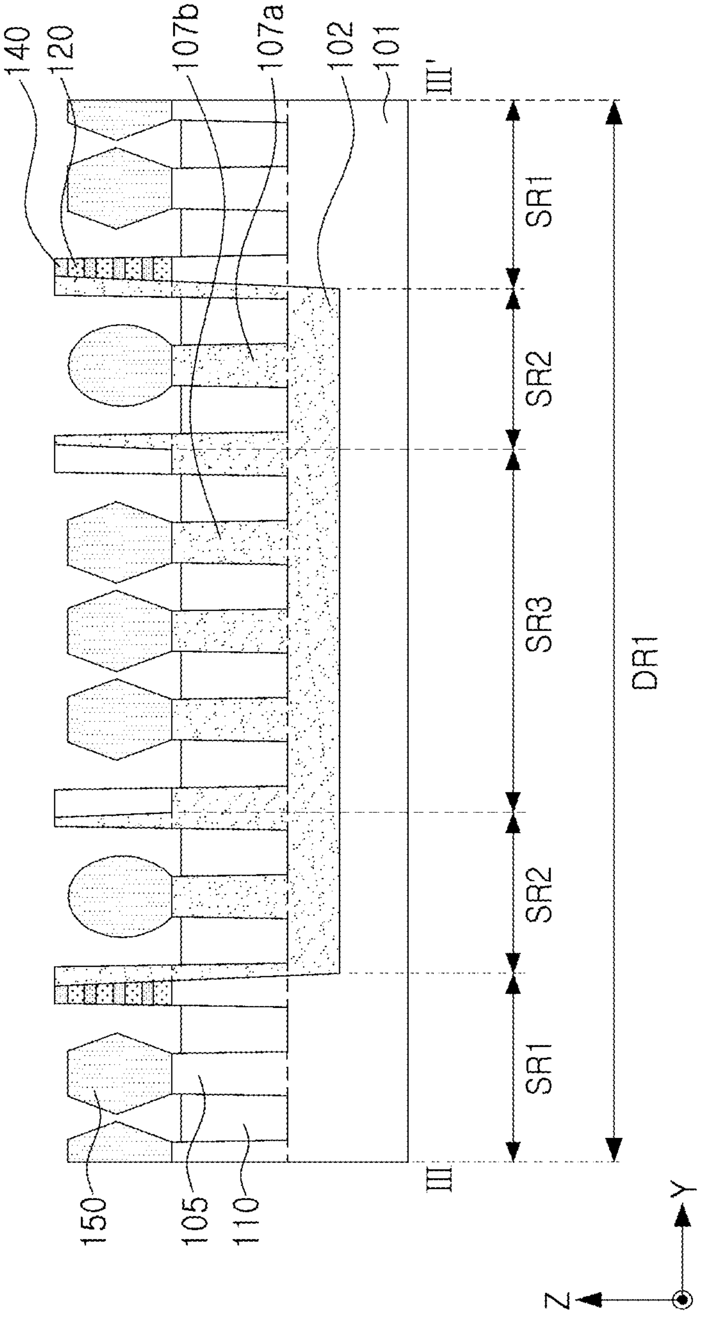

Referring to FIGS. 15A and 15B, sacrificial gate structures PG and gate spacer layers 164 may be formed in the first and second device regions DR1 and DR2.

The sacrificial gate structure PG may be a sacrificial structure formed in a region in which a gate dielectric layer 162, a gate electrode 165, and a gate capping layer 166 are disposed on the channel layers 140, as illustrated in FIGS. 2B and 8A, through a subsequent process. The sacrificial gate structures PG may have a linear shape intersecting the first to third active structures AS1, AS2, and AS3 and the active structures AS and extending in one direction. The sacrificial gate structures PG may extend, for example, in the Y-direction, and may be disposed to be spaced apart from each other in the X-direction.

The sacrificial gate structure PG may include first and second sacrificial gate layers 202 and 205 and a mask pattern layer 206, sequentially stacked. The first and second sacrificial gate layers 202 and 205 may be patterned using the mask pattern layer 206. The first and second sacrificial gate layers 202 and 205 may be an insulating layer and a conductive layer, respectively, but the present inventive concept is not limited thereto, and the first and second sacrificial gate layers 202 and 205 may be formed as a single layer. For example, the first sacrificial gate layer 202 may include silicon oxide, and the second sacrificial gate layer 205 may include polysilicon. The mask pattern layer 206 may include silicon oxide and/or silicon nitride.

The gate spacer layers 164 may be formed on both sidewalls of the sacrificial gate structures PG. The gate spacer layers 164 may be formed of a low-K material, and may include, for example, at least one of SiO, SiN, SiCN, SiOC, SiON, or SiOCN.

Figure 16B:
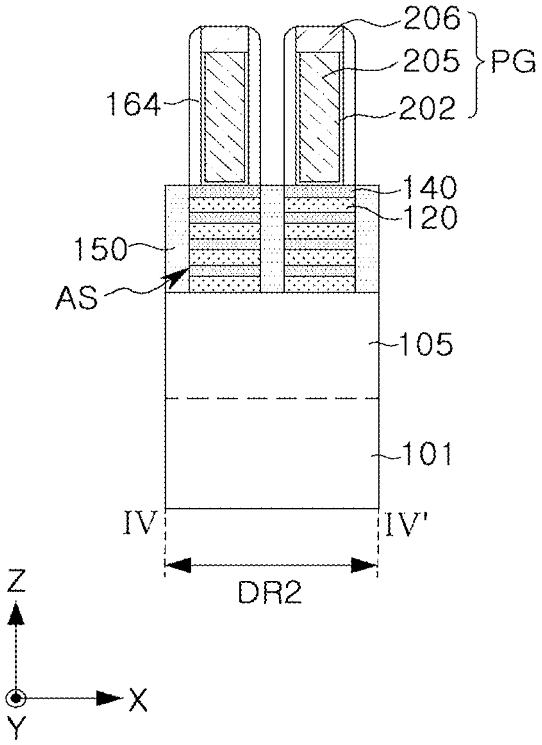

Referring to FIGS. 16A and 16B, in the first and second device regions DR1 and DR2, upper portions of the first to third active structures AS1, AS2, and AS3 and upper portions of the active structures AS, exposed by the sacrificial gate structure PG, may be partially removed to form recess regions, and source layers 150 may be formed in the recess regions.

First, exposed portions of the first to third active structures AS1, AS2, and AS3, the sacrificial layers 120, and the channel layers 140 may be removed, using the sacrificial gate structures PG and the gate spacer layers 164 as masks, to form recess regions. In some embodiments, in the second device region DR2, portions of the sacrificial layers 120 exposed from the recess regions may be removed in a lateral direction to form inner spacer layers.

Source layers 150 may be formed by growing in the recess regions by an epitaxial process. The source layers 150 may include impurities by in-situ doping, and may include a plurality of layers having different doping elements and/or different doping concentrations. In the first device region DR1, the source layers 150 may include first conductivity-type impurities in the first and third semiconductor regions SR1 and SR3, and second conductivity-type impurities in the second semiconductor region SR2.

Figure 17A:
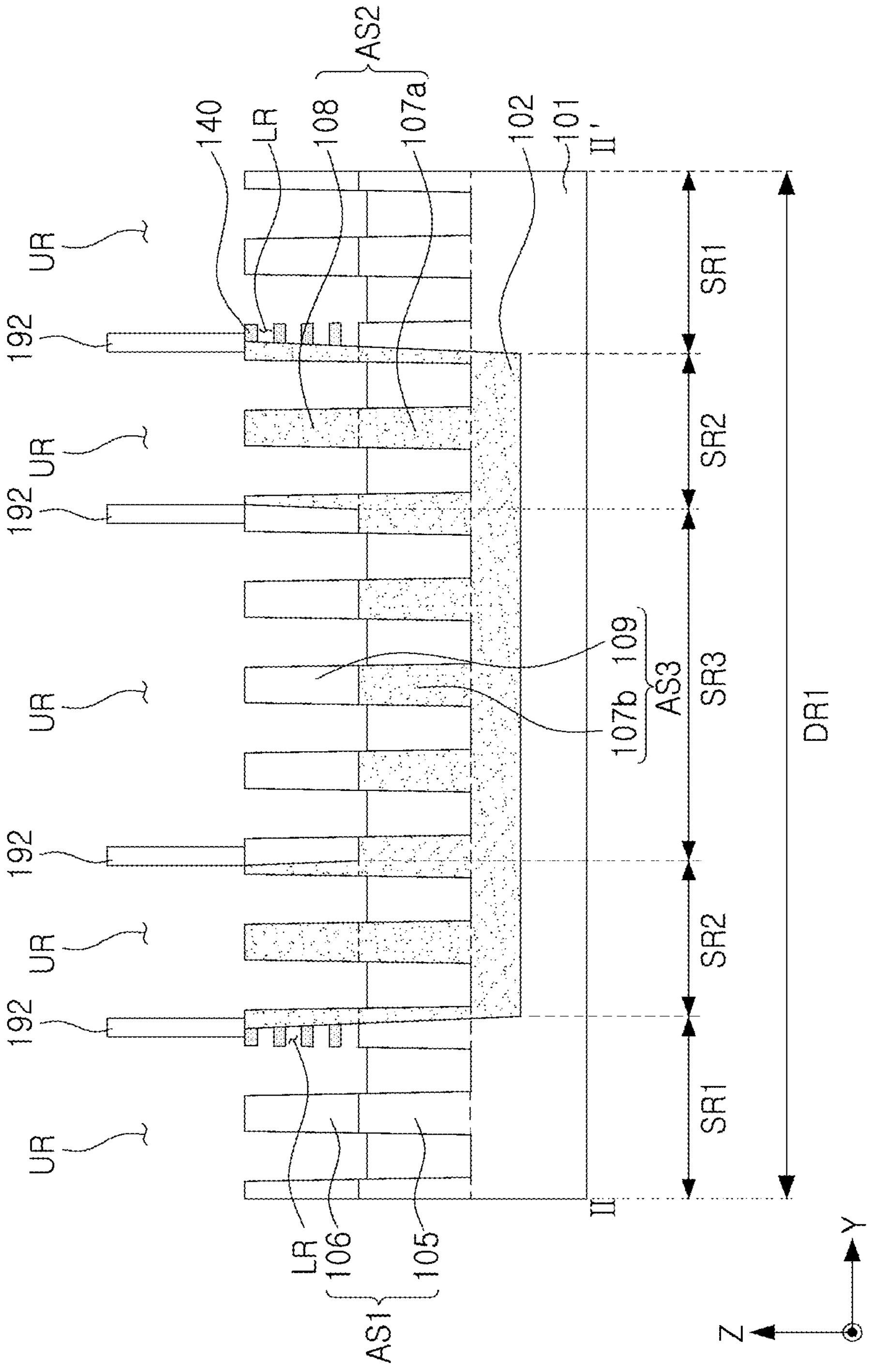
Figure 17B:
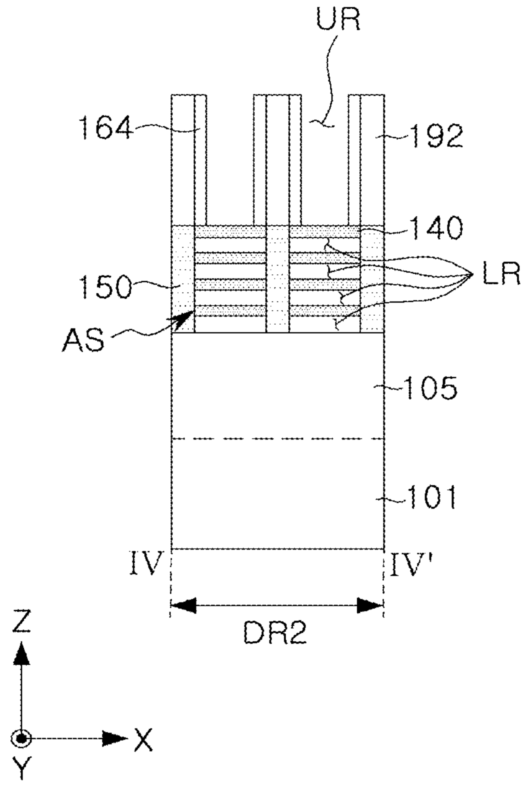

Referring to FIGS. 17A and 17B, a first interlayer insulating layer 192 may be formed, and the sacrificial gate structures PG and the sacrificial layers 120 may be removed to form upper and lower gap regions UR and LR.

The first interlayer insulating layer 192 may be formed by forming an insulating film covering the sacrificial gate structures PG and the source layers 150, and performing a planarization process to expose the mask pattern layer 206.

The sacrificial gate structures PG and the sacrificial layers 120 may be selectively removed with respect to the gate spacer layers 164, the first interlayer insulating layer 192, and the channel layers 140. First, the sacrificial gate structures PG may be removed to form the upper gap regions UR, and then the sacrificial layers 120 exposed through the upper gap regions UR may be removed to form the lower gap regions LR.

Figure 18A:
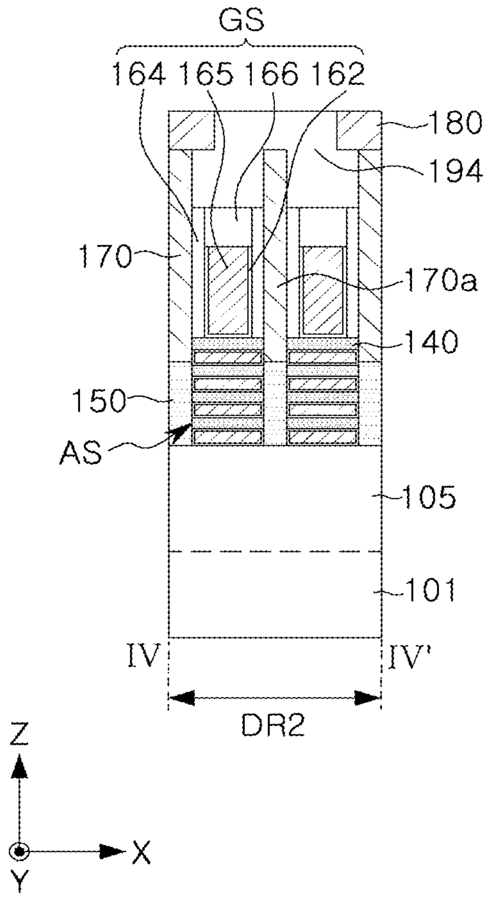
Figure 18B:
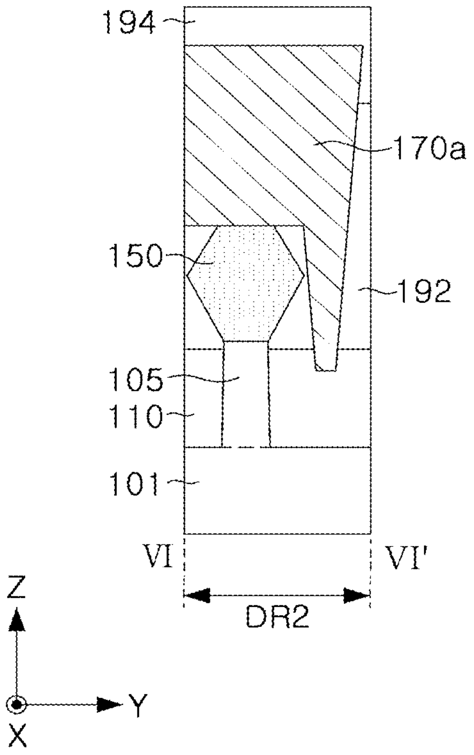

Referring to FIGS. 18A and 18B, in the second device region DR2, gate structures GS may be formed, first and second contact plugs 170 and 170*a* and interconnection lines 180 may be formed, and a second interlayer insulating layer 194 may be formed. Similarly, dummy gate structures DGS and contact plugs 170 may be formed in the first device region DR1, as illustrated in FIG. 2B.

Gate structures GS may be formed to fill the upper gap regions UR and the lower gap regions LR. The gate dielectric layers 162 may be formed to conformally cover inner surfaces of the upper gap regions UR and inner surfaces of the lower gap regions LR. After the gate electrode 165 is formed to completely fill the upper gap regions UR and the lower gap regions LR, the gate electrode 165 may be removed together with the gate dielectric layers 162 by a predetermined depth from an upper portion of the upper gap regions UR, to form the gate capping layer 166. In some embodiments, the gate capping layer 166 may be formed after also removing a portion of the gate spacer layers 164. Therefore, the gate structures GS may be formed in the second device region DR2, and dummy gate structures DGS having the same structure may be formed in the first device region DR1.

Next, a second interlayer insulating layer 194 may be formed on the gate structures GS, and the first and second interlayer insulating layers 192 and 194 may be partially removed to form contact holes exposing the source layers 150. First contact plugs 170 may be formed by filling a conductive material in the contact holes. Although not illustrated, contact plugs connected to the gate electrode 165 may be further formed on the gate structures GS. Second contact plugs 170*a* may be formed to be relatively deep in some regions. Interconnection lines 180 may be formed on the first contact plugs 170.

In the first device region DR1, the contact plugs 170 and the interconnection lines 180 may be formed in the same manner. Therefore, the second device 200 of FIG. 7 may be manufactured to have the structure of FIGS. 2A to 2C.

Figure 19A:
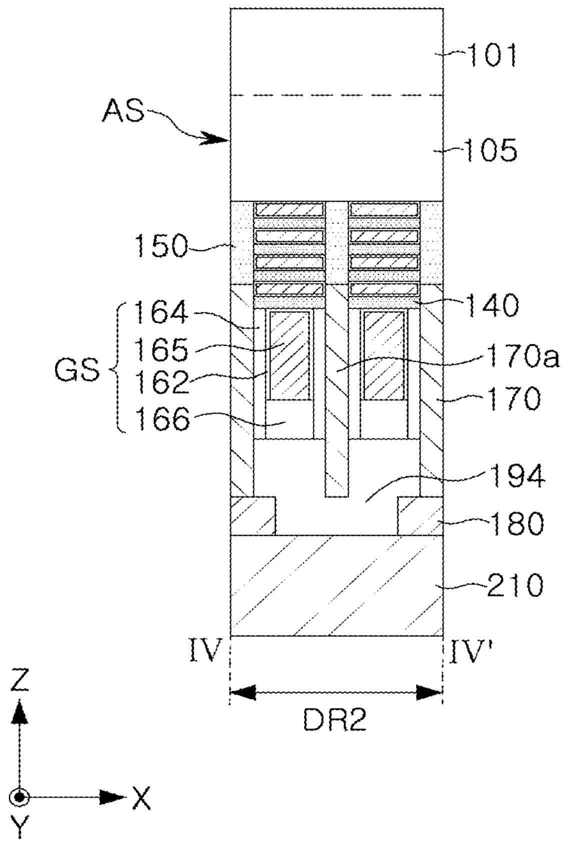
Figure 19B:
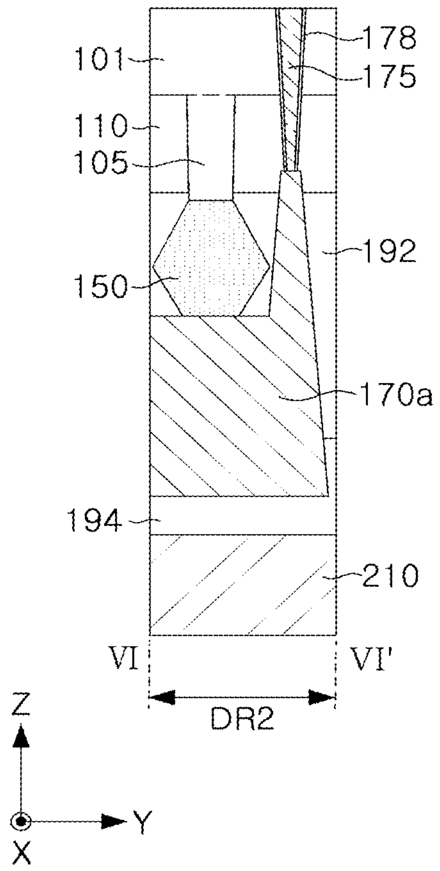

Referring to FIGS. 19A and 19B, a backside contact plug 175 may be formed in the second device region DR2.

First, an entire structure manufactured may be flip-bonded to a carrier substrate 210. Therefore, the entire structure may be turned upside down, whereby the semiconductor layer 101 may be exposed in an upward direction.

The backside contact plug 175 may be formed after removing the semiconductor layer 101 from an upper surface thereof by a predetermined thickness. In embodiments, a thickness from which the semiconductor layer 101 is removed may be variously changed. For example, in some embodiments, all of the semiconductor layer 101 of the second device region DR2 may be removed.

The backside contact plug 175 may be formed by passing through the semiconductor layer 101 and a portion of the device isolation layer 110, to form a contact hole exposing the second contact plug 170*a*, forming a contact insulating layer 178, and filling the conductive material.

Next, referring to FIGS. 8A to 8C together, a third interlayer insulating layer 196 may be formed on the backside contact plug 175, a buried interconnection line 185 passing through the third interlayer insulating layer 196 and connected to the backside contact plug 175 may be formed, and the carrier substrate 210 may be removed.

In some embodiments, an interconnection structure may be further formed below the buried interconnection line 185. Therefore, the second device 200 of FIGS. 8A to 8C may be manufactured.

By including a vertical PNP device including an epitaxially grown layer, a semiconductor device having improved degree of integration and electrical characteristics may be provided.

The various advantages and effects of the present inventive concept are not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
- a semiconductor layer including first conductivity-type impurities;
- first active structures extending upwardly from the semiconductor layer and including the first conductivity-type impurities;
- a first epitaxial layer in the semiconductor layer, wherein the first epitaxial layer includes second conductivity-type impurities;
- second active structures extending upwardly from the first epitaxial layer, between the first active structures in a first direction, wherein the second active structures include the second conductivity-type impurities;
- third active structures extending upwardly from the first epitaxial layer, between the second active structures in the first direction, wherein the third active structures include the first conductivity-type impurities;
- dummy gate structures intersecting the first and second active structures on the semiconductor layer, respectively, and extending in a second direction; and
- a dummy active structure between the second active structures and the third active structures in the first direction, wherein the dummy active structure includes a first region including the first conductivity-type impurities and a second region including the second conductivity-type impurities,
- wherein at least one of the second and third active structures includes a second epitaxial layer that integrates with the first epitaxial layer.

2. The semiconductor device of claim 1, wherein the third active structures overlap the first epitaxial layer in a third direction, perpendicular to an upper surface of the semiconductor layer.

3. The semiconductor device of claim 1, wherein, in a plan view, the second active structures at least partially surround the third active structures, and the first active structures at least partially surround the second active structures.

4. The semiconductor device of claim 1, wherein a lower surface and side surfaces of the first epitaxial layer are in contact with the semiconductor layer.

5. The semiconductor device of claim 1, further comprising an insulating liner layer between the first epitaxial layer and the semiconductor layer.

6. The semiconductor device of claim 1, wherein, in the dummy active structure, the first region is adjacent to the third active structures, and the second region is adjacent to the second active structures.

7. The semiconductor device of claim 1, wherein the dummy active structure further comprises an insulating liner layer between the first region and at least a portion of the second region.

8. The semiconductor device of claim 1, wherein the first active structures comprise first lower regions extending from the semiconductor layer, the second active structures comprise second lower regions extending from the first epitaxial layer, and the third active structures comprise third lower regions extending from the first epitaxial layer, wherein a length from a lower surface of the semiconductor layer to upper surfaces of the first to third lower regions is about 100 nanometers (nm) to about 700 nm.

9. The semiconductor device of claim 1, wherein the dummy gate structures extend to further intersect the third active structures, and wherein the semiconductor device further comprises:

first source layers on the first active structures outside the dummy gate structures, wherein the first source layers include the first conductivity-type impurities;

second source layers on the second active structures outside the dummy gate structures, wherein the second source layers include the second conductivity-type impurities; and third source layers on the third active structures outside the dummy gate structures, wherein the third source layers include the first conductivity-type impurities.

10. The semiconductor device of claim 9, further comprising contact plugs on the first to third source layers.

11. A semiconductor device comprising:

a semiconductor layer including first conductivity-type impurities;

first active structures extending upwardly from the semiconductor layer and including the first conductivity-type impurities;

a first epitaxial layer in the semiconductor layer, wherein the first epitaxial layer includes second conductivity-type impurities;

second active structures extending upwardly from the first epitaxial layer, between the first active structures in a first direction, wherein the second active structures include the second conductivity-type impurities;

third active structures extending upwardly from the first epitaxial layer, between the second active structures in the first direction, wherein the third active structures include the first conductivity-type impurities;

dummy gate structures intersecting the first and second active structures on the semiconductor layer, respectively, and extending in a second direction; and a dummy active structure between the first active structures and the second active structures, wherein the dummy active structure includes a first region including the second conductivity-type impurities and a second region including dummy channel layers spaced apart from each other in a third direction, perpendicular to an upper surface of the semiconductor layer.

12. The semiconductor device of claim 11, wherein, in the dummy active structure, the first region is adjacent to the second active structures, and the second region is adjacent to the first active structures.

13. The semiconductor device of claim 1, wherein the dummy gate structures are spaced apart between the first active structures and the second active structures and are spaced apart between the second active structures and the third active structures, in the second direction.

* * * * *